United States Patent [19]

Ogawara et al.

[11] Patent Number: 5,198,814
[45] Date of Patent: Mar. 30, 1993

[54] DIGITAL-TO-ANALOG CONVERTER WITH CONVERSION ERROR COMPENSATION

[75] Inventors: Takeshi Ogawara; Tomio Takiguchi, both of Tokyo, Japan

[73] Assignee: NEC Corporation, Tokyo, Japan

[21] Appl. No.: 800,922

[22] Filed: Nov. 27, 1991

[30] Foreign Application Priority Data

Nov. 28, 1990 [JP] Japan ................................ 2-326344

[51] Int. Cl.$^5$ ............................................... H03M 1/06
[52] U.S. Cl. ..................................... 341/118; 341/145
[58] Field of Search ........................ 341/118, 145, 146

[56] References Cited

U.S. PATENT DOCUMENTS

| 4,340,882 | 7/1982 | Maio et al. | 341/118 |
| 4,808,998 | 2/1989 | Yamada | 341/118 |
| 4,843,392 | 6/1989 | Gulczynski | 341/145 |
| 4,963,870 | 10/1990 | Obinata | 341/118 |

Primary Examiner—Marc S. Hoff

[57] ABSTRACT

A digital-to-analog converter having a main analog conversion part which carries out digital to analog conversion of input digital signals, an auxiliary analog conversion part which compensates the digital-to-analog conversion error, a memory circuit which accumulates the compensation data for compensating the conversion error, a register circuit which inputs the output signal of the memory circuit, and a matrix switching circuit which selects the output signal of the register circuit by means of the higher order bits of the input digital signal.

Prior to the start of the digital-to-analog conversion operation the compensation data accumulated in the memory circuit are transferred to the register circuit. Later, at the time of the digital to analog conversion operation the matrix switching circuit is controlled by means of the higher order bits of the input digital signal selects the data held in the register circuit, and carries out the compensation of the error in the analog conversion.

7 Claims, 18 Drawing Sheets

DIGITAL-TO-ANALOG CONVERTER WITH CONVERSION ERROR COMPENSATION

BACKGROUND OF THE INVENTION

The present invention relates to a digital-to-analog converter, and more particularly, to a digital-to-analog converter having a conversion error compensation circuit.

DESCRIPTION OF THE PRIOR ART

High resolution digital-to-analog converters (abbreviated as DACs hereinafter) adapted for mixed systems of analog and digital signals such as digital audio systems and precision instrumentation systems are on the market with widespread use. Of these DACs that are incorporated in products intended for general consumers, such as digital audio systems, are strongly dominated by the price of the product, so that rendering them monolithic is prerequisite. However, in spite of the rapid advancement of the IC-related technologies, the bit number per sample value of the digital input signals (referred to as DA conversion resolution or simply conversion resolution hereinafter) that can be converted by means of the conventional monolithic DAC is of the order of 10 bits. Moreover, the conversion resolution is dependent on a process that requires individual machining of the semiconductor IC chips, such as laser trimming of the resistor region which is a component of the DAC. Accordingly, the constraint on the productivity is severe. Not only that, the deterioration with lapse of time of the resolution of the IC chip components that are the objects of the trimming is inevitable, so that the upper limit of the resolution has been considered to be of the order of 14 bits even if the conditions for the machining are chosen optimally.

As a means for breaking the upper limit through, K. Maio, et al. proposed a high resolution DAC whose resolution is improved to 14 bits without depending upon the above-mentioned trimming, in a paper entitled "Untrimmed DAC with 14b Resolution", ISSCC Digest of Technical Papers, February 1981, pp. 24–25. The DAC according to the proposal called also as the "self-compensation technique" includes a main DAC part which carries out the DA conversion of digital input signals with the resolution of 14 bits per sample value and an auxiliary DAC which corrects the DA conversion error, namely, the linear error generated by the portion corresponding to the highest order five bits of the main DAC part. The DA conversion error that is generated by the main DAC part is measured in advance and the result is accumulated in a memory that is built in the DAC. The DA conversion error is canceled by adding the output read from the memory to the DA converted output of the main DAC part in opposite polarity. The technique according to this proposal is effective for compensating the DAC conversion error and has a tendency to be adopted widely. However, the linear error compensation according to this conventional technique is accompanied by the data read in the auxiliary DAC part from the built-in memory for the purpose of canceling the conversion error, which makes the response speed of the DAC as a whole to be low. Of the DAC of this type available in the market so far, the response time is 1.2 μs at best even for one with the smallest response time. Nearly one half of the response time, namely, 0.5 μs is occupied by the time for reading from the memory. Even such a large response time will not be of particular practical impediment for DACs that handle digital signals with relatively small bit rate such as the DAC for the digital audio systems. However, in a DAC which handles image signals such as the signals of a high definition television (HDTV) the bit rate of the input signal exceeds 50 MHz. In order to respond to digital input signals with such a high bit rate it is necessary to suppress the response time to less than 20 ns and the read time of the memory to less than 10 ns, and in particular to suppress the influence of the read time of the memory to a possible minimum level.

SUMMARY OF THE INVENTION

It is therefore the object of the present invention to provide a high resolution and high speed DAC which substantially eliminates the influence of the time required for reading a built-in memory that accumulates a conversion error data.

The DAC according to the present invention includes a main DA conversion part which carries out the DA conversion of input digital signals supplied in bit parallel, an auxiliary DA conversion part which compensated for the DA conversion error between the input digital signal and the output of the main DA conversion part generated accompanying the DA conversion, a memory circuit which accumulates an error data that corresponds to the DA conversion error detected in advance, a register circuit which continuously outputs the error data read from the memory circuit to an output terminal in bit-parallel fashion, and matrix switching means which supplies the output of the register circuit to the auxiliary DA conversion part in response to the respective predetermined higher order bits of a series a digital code words that from the input digital signals, and outputs a DA converted output which is free from the DA conversion error.

In the DAC according to the present invention, error data to be compensated for the conversion error are constantly supplied from the parallel output end of the register circuit to the matrix switch without requiring the reading of the error data from the memory circuit whenever there is the application of the code word of the input digital signal to be compensated, so that it is possible to improve the response speed markedly compared with the conventional DAC of self-compensation technique.

BRIEF DESCRIPTION OF THE DRAWINGS

The above-mentioned and other objects, features, and advantages of this invention will become more apparent by reference to the following detailed description of the invention taken in conjunction with the accompanying drawings, wherein.

DETAILED DESCRIPTION OF THE INVENTION

Figure 1:
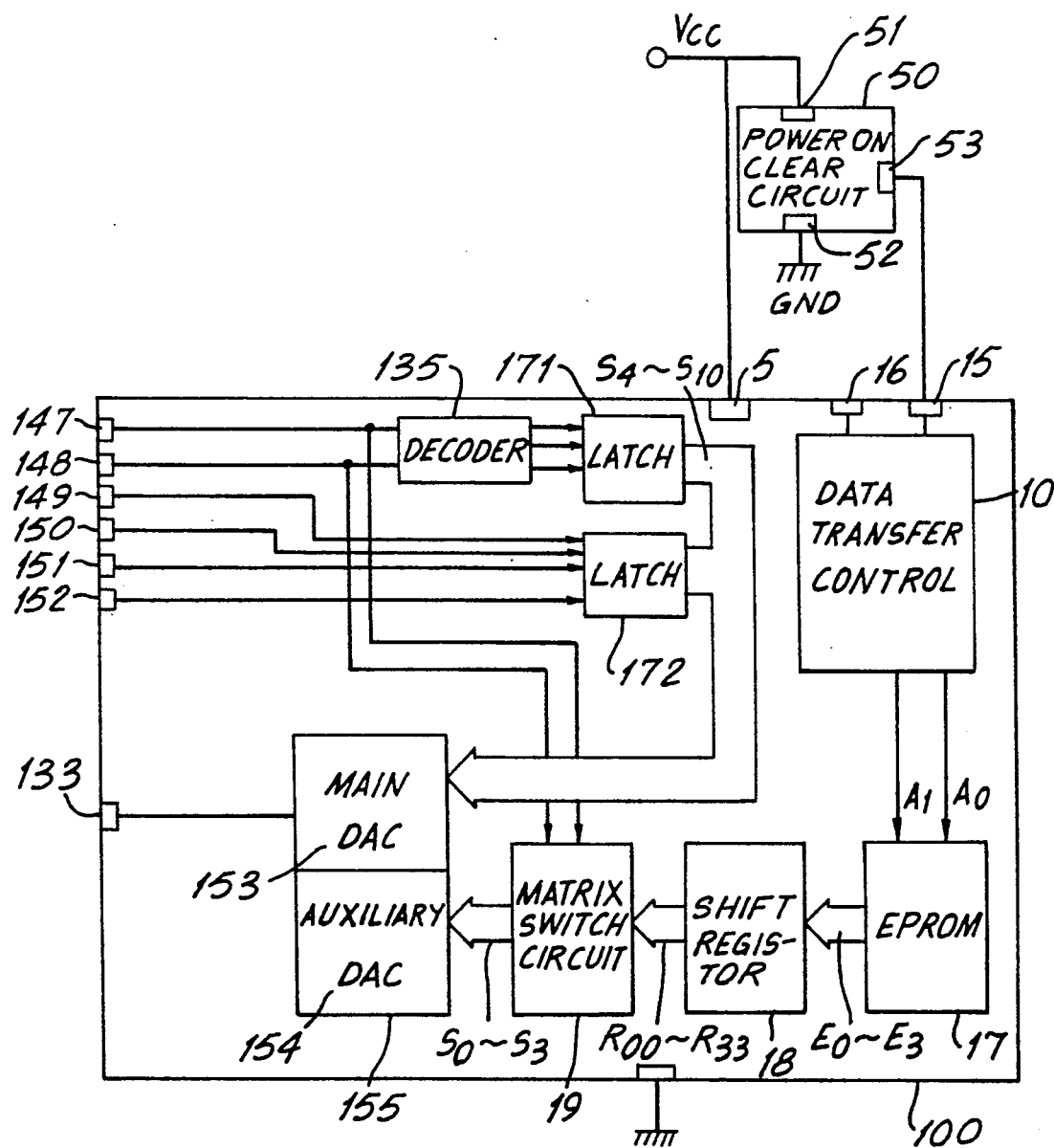
FIG. 1 is an overall block diagram for a first embodiment of the present invention.
Figure 2A:
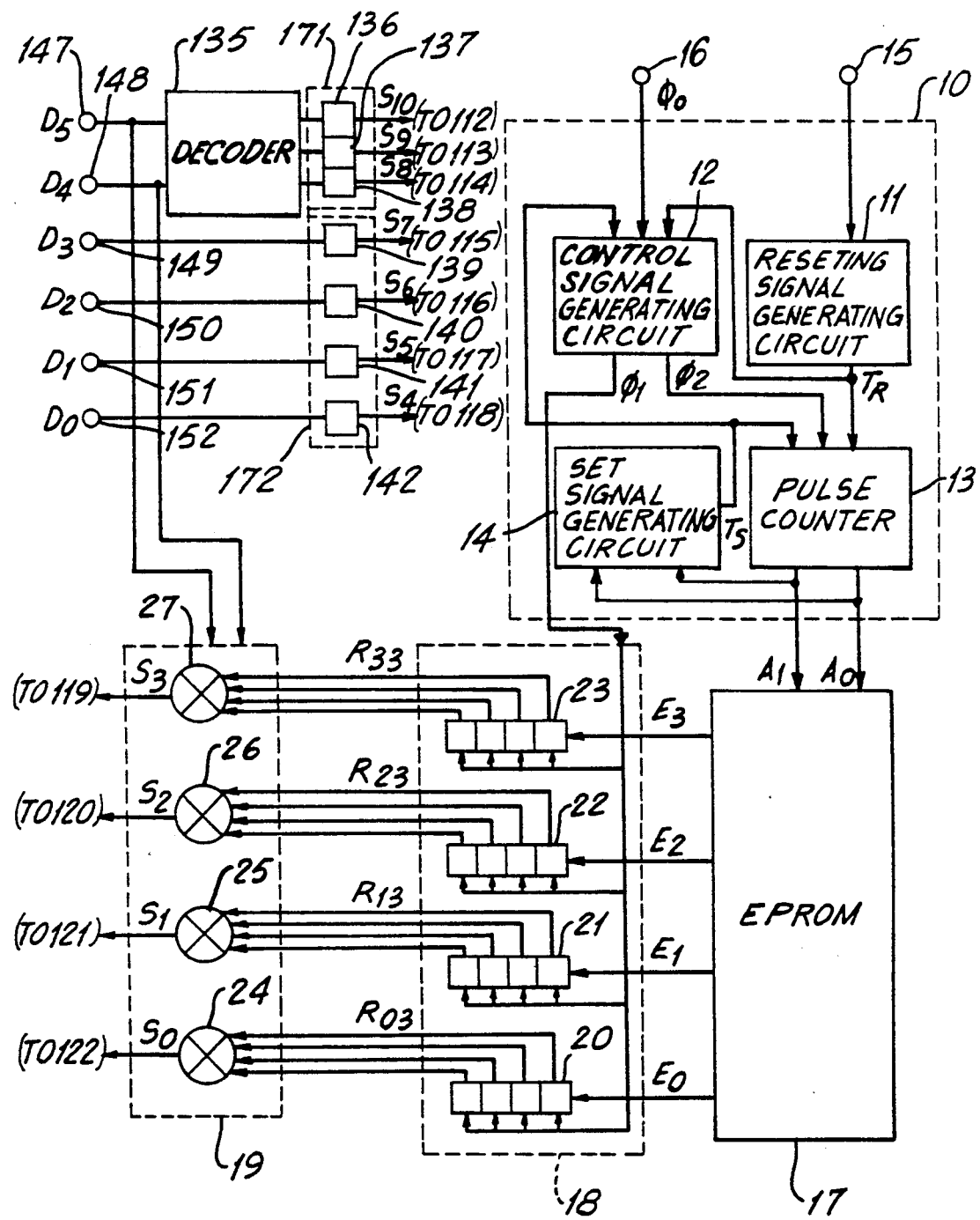
FIG. 2(a) is a circuit diagram for a part of the DAC in FIG. 1.

Referring to FIG. 1 and FIG. 2(a) which show the DAC of the first embodiment of the present invention, the DAC 100 includes a first power terminal 5 connected to a voltage Vcc, a second power terminal 6 connected to the grounding potential, input terminals 147 to 152 which receive input digital signals in bit parallel as a string of 6-bit code words of $D_0$ to $D_5$, a decoder 135 connected to the input terminals 147 and 148 and receives the supply of the two higher order bits $D_5$ and $D_4$ of the six bits $D_0$ to $D_5$, a first latch circuit group 171 consisting of the latch circuits 136 to 138 connected to the outputs of the decoder 135, and a second latch circuit group 172 consisting of the latch circuits 139 to 143 connected respectively to the input terminals 149 to 152 and receives the supply of the four lowest order bits, $D_3$ to $D_0$ of the six bits $D_0$ to $D_5$.

The DAC further includes a data transfer control circuit 10 which is equipped with a control signal generation circuit 12 connected to a control signal input terminal 16 which receives the supply of control signal $\phi_0$, a reset signal generation circuit 11 which receives via an output terminal 53 and an input terminal 15 the output of a power on clear circuit 50 which generates a clear pulse in response to the application of Vcc accompanying the turning on of a power switch (not shown), a pulse counter 13 which has the output signal $T_R$ of the circuit 11 and one of the output signal $\phi_2$ of the control signal generation circuit 12 as the input signals, and a set signal generation circuit 14 which has a pair of digital output signals $A_1$ and $A_0$ of the counter 13 as the input signals and generates the stop signal Ts of the control signal generation circuit 12 and the counter 13.

The DAC further has an EPROM 17 with 16-bit storage capacity and has the two bit parallel output signal ($A_1$, $A_0$) from the counter as the address signals, a shift register circuit 18 having registers 20 to 23 that holds the four digital code words of the parallel four bits, and fetches the output of the EPROM 17, namely, the parallel 4-bit code words $E_0$ to $E_3$, in response to an output signal $\phi_1$ from the control signal generation circuit 12, and a matrix switch circuit 19 which includes semiconductor switches 24 to 27 controlled by means of the highest order two bits $D_5$ and $D_4$, and selects the output signals $R_{03}$ to $R_{33}$ of the shift register circuit 18 by semiconductor switches 24 to 27 to convert them to output code words $S_0$ to $S_3$. For the semiconductor switches 24 to 27 use may be made of ¼ selectors.

Figure 2B:
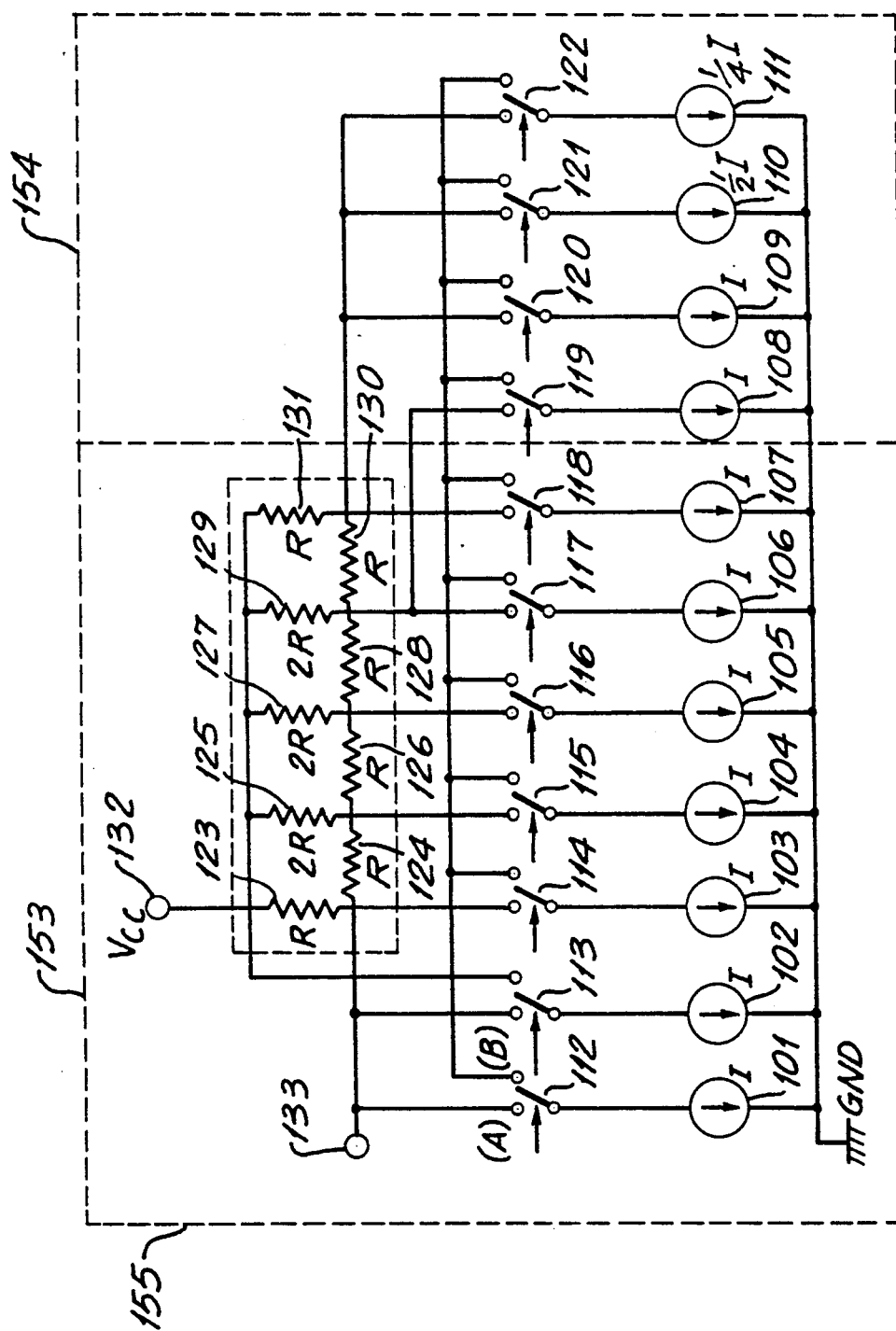
FIG. 2(b) is a circuit diagram for another part of the DAC in FIG. 1.

Referring also to FIG. 2(b), the DAC part 155 of the DAC 100 consists of a main DAC part 153 and an auxiliary DAC part 154. The switching on/off of the switching cells 112 to 118 are controlled by the control signals $S_4$ to $S_{10}$ from the first and the second latch circuit groups 171 and 172 (FIG. 2(a)), and the switching on/off of the switching cells 119 to 122 are controlled by the control signals $S_0$ to $S_3$ from the matrix switching circuit 19 (FIG. 2(a)).

Referring to FIG. 2(b), the main DAC part has a resistor element group 174 which is formed by connecting in ladder form the resistor elements 123, 124, 126, 128, 130, and 131 having respectively a resistance value R and the resistors 125, 127, and 129 having respectively a resistance of 2R, where one end of each of the resistor elements 123, 125, 127, 129, and 131 is connected the power terminal 132 of the voltage Vcc, and the switching elements 112 to 118 whose switching on/off is controlled by the respective bits $S_4$ to $S_{10}$ of the code words from the first and the second latch circuit groups 171 and 172 (FIG. 2(a)), and whose moving contacts are connected respectively to the constant current sources 101 to 107 with a current value I and one of the fixed contact of each of them is connected to the power terminal 132 while the other of the fixed contact of each of them is connected to the appropriate connection point of the resistor elements.

On the other hand, the auxiliary DAC part 154 includes the switching elements 119 to 122 whose switching on/off is controlled in response to the bit-parallel code words $S_0$ to $S_3$ of the matrix switching circuit 19 (FIG. 2(a)), whose moving contacts are connected respectively to the constant current sources 108 and 109 with current I, the constant current sources 110 and 111 with current values I/2 and I/4, respectively, and one end of each of the fixed contacts is connected to the power terminal 132 while the other end of each of the fixed contacts is connected to the appropriate junction of the resistor element group 174.

A DA conversion output terminal 133 which is connected to the junction of the serially connected resistor elements 123 and 124 forms the output terminal of the DAC part 155, that is, the output terminal of the DAC 100.

Figure 2C:
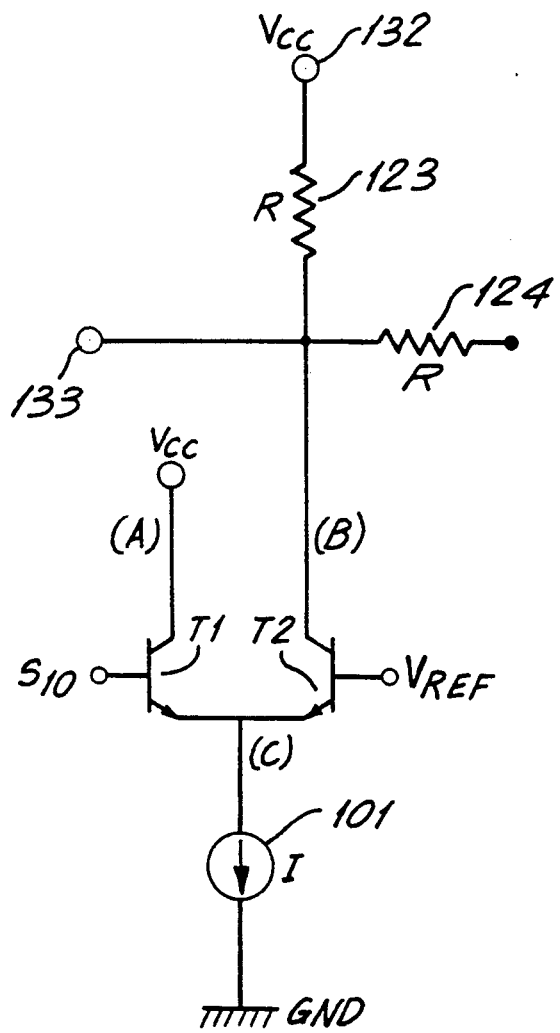
FIG. 2(c) is a more detailed circuit diagram for a part of the circuit shown in FIG. 2(b)
Figure 2:
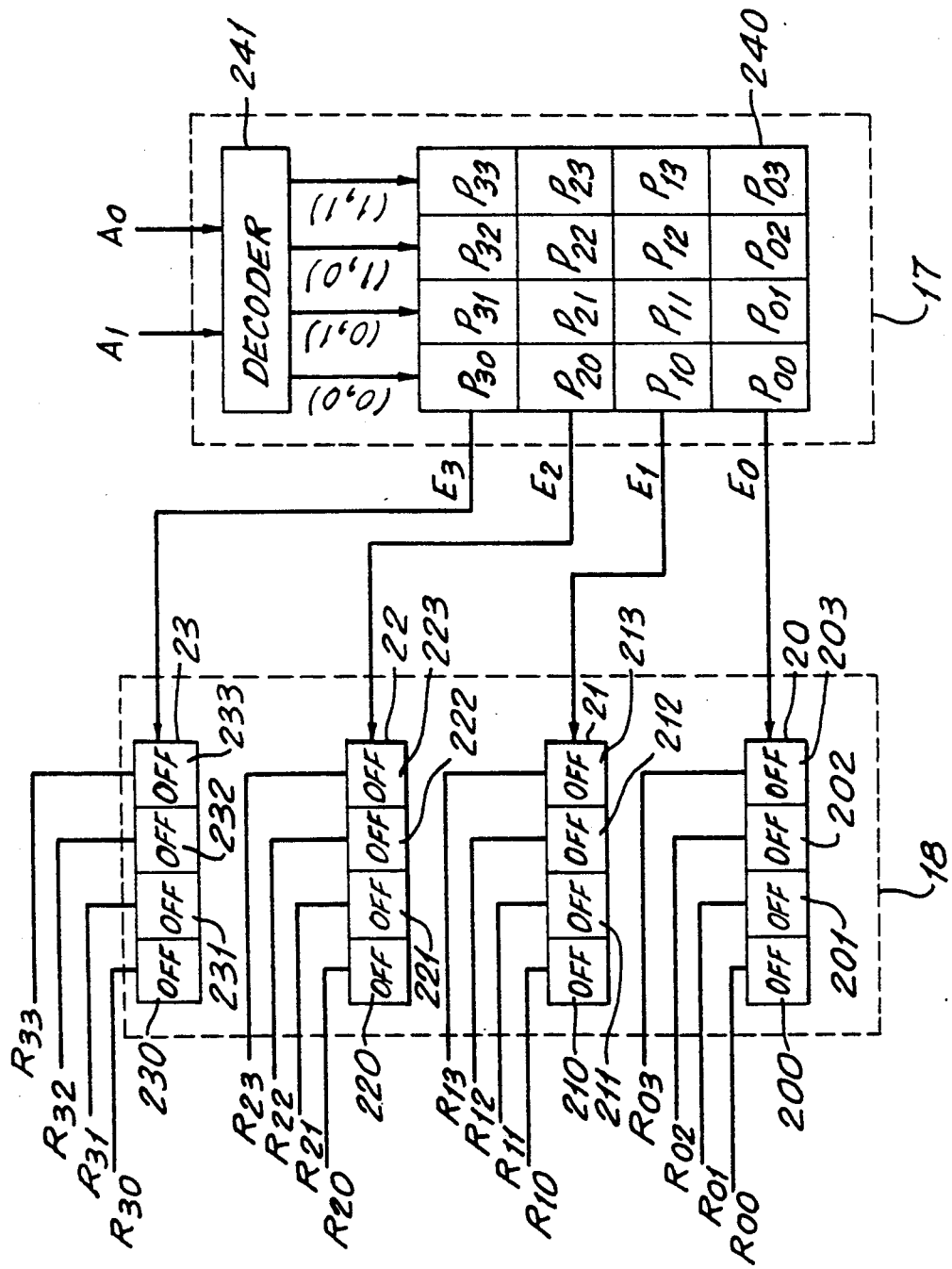
FIG. 2(d) shows a block diagram for the memory circuit and the register circuit of the DAC in FIG. 1.

Referring to FIG. 2(c) which shows that each of the switching elements 112 to 122 is formed in an IC chip common to other components, the switching element 112 shown in the figure has bipolar transistors $T_1$ and $T_2$ that are connected in the form of an emitter coupled logic (ECL) circuit. The collector and the base of the transistor $T_1$ are connected to the power terminal 132 and the output signal $S_{10}$ of the first latch circuit group 171, respectively, while the collector and the base of the transistor $T_2$ are connected to the DA output terminal 133 and a reference potential $V_{REF}$, respectively. The emitters of each of the transistors $T_1$ and $T_2$ are connected commonly to the constant current source 101. The circuit structure of the switching element 112 is also common to other switching elements 113 to 122. It should be noted that the points (A), (B), and (C) in FIG. 2(b) correspond to the points (A), (B), and (C) in FIG. 2(c), respectively.

Next, referring to FIG. 2(d), the EPROM 17 has a decoder 241 which decodes the code words ($A_1$, $A_0$) from the counter 13 (FIG. 2(a)) and a memory cell array 240 which has a capacity of 4×4 bits corresponding to the addresses (0, 0) to (3, 3) (in the figure the memory address (x, y) is represented by $P_{xy}$ so that the abovementioned addresses correspond to $P_{00}$ to $P_{33}$).

The decoder 241 selects the zero-th column ($P_{00}$, $P_{10}$, $P_{20}$, $P_{30}$) when the input code words ($A_1$, $A_0$) are (0,0), and analogously selects the first column ($P_{01}$, $P_{11}$, $P_{21}$, $P_{31}$), the second column ($P_{02}$, $P_{12}$, $P_{22}$, $P_{32}$) and the third column ($P_{03}$, $P_{13}$, $P_{23}$, $P_{33}$) when the code words are (0,1), (1,0), and (1,1), respectively. Further, the EPROM 17 outputs the read outputs $E_0$ to $E_3$ for the 0-th row to the third row. Further, the shift register circuit 18 that includes registers 20 to 23 each having 4-bit construction includes a register 20 consisting of the D flip-flops (DFFs) 200 to 203 which output the code word ($R_{00}$, $R_{01}$, $R_{02}$, $R_{03}$), a register 21 consisting of the DFFs 210 to 213 which output the code word ($R_{10}$, $R_{11}$, $R_{12}$, $R_{13}$), a register 22 consisting of the DFFs 220 to 223 which output the code word ($R_{20}$, $R_{21}$, $R_{22}$, $R_{23}$), and a register 23 consisting of the DFFs 230 to 233 which output the code word ($R_{30}$, $R_{31}$, $R_{32}$, $R_{33}$).

Figure 3:
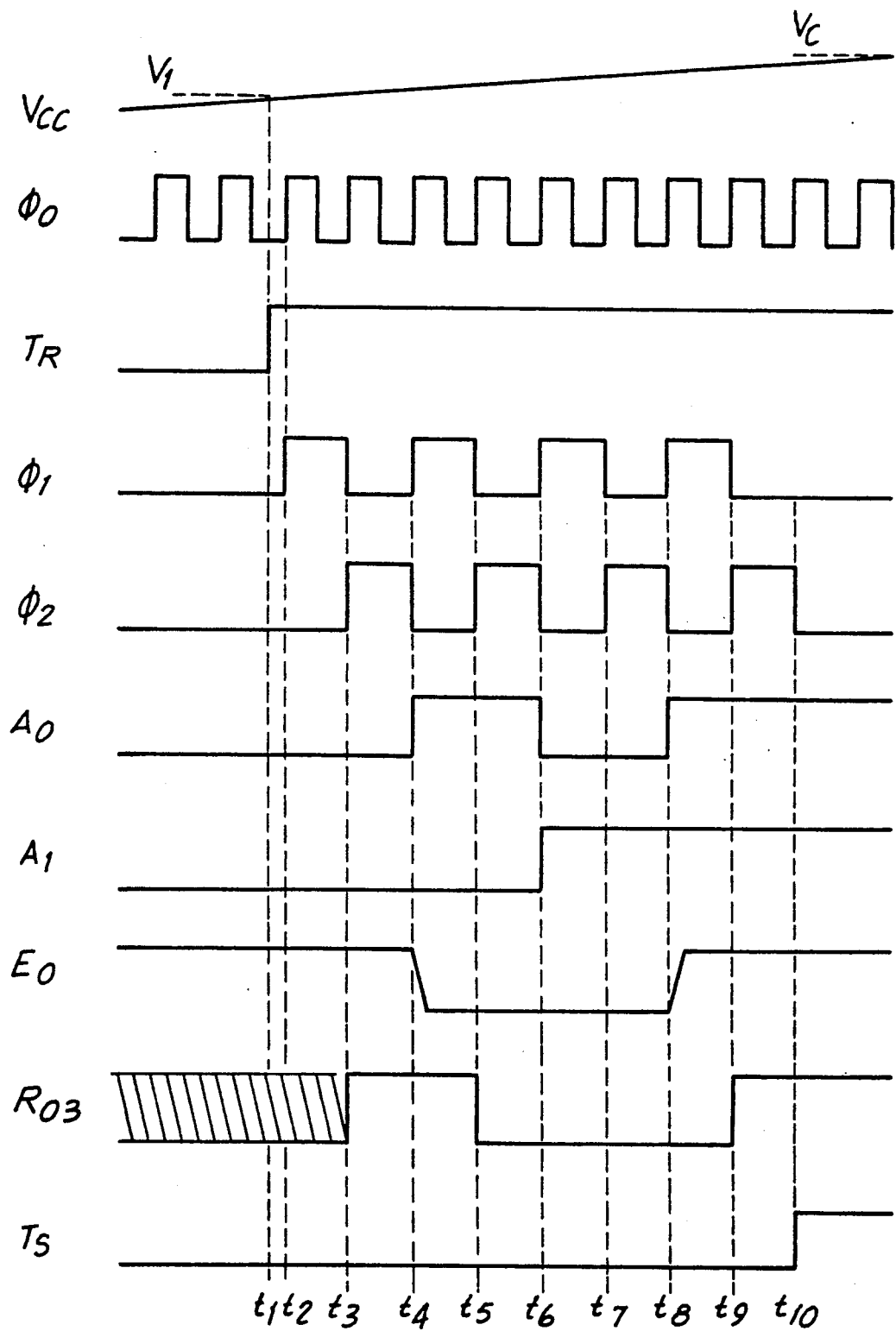
FIG. 3 is a signal waveform diagram for describing the operation of the DAC of the present embodiment.
Figure 4A:
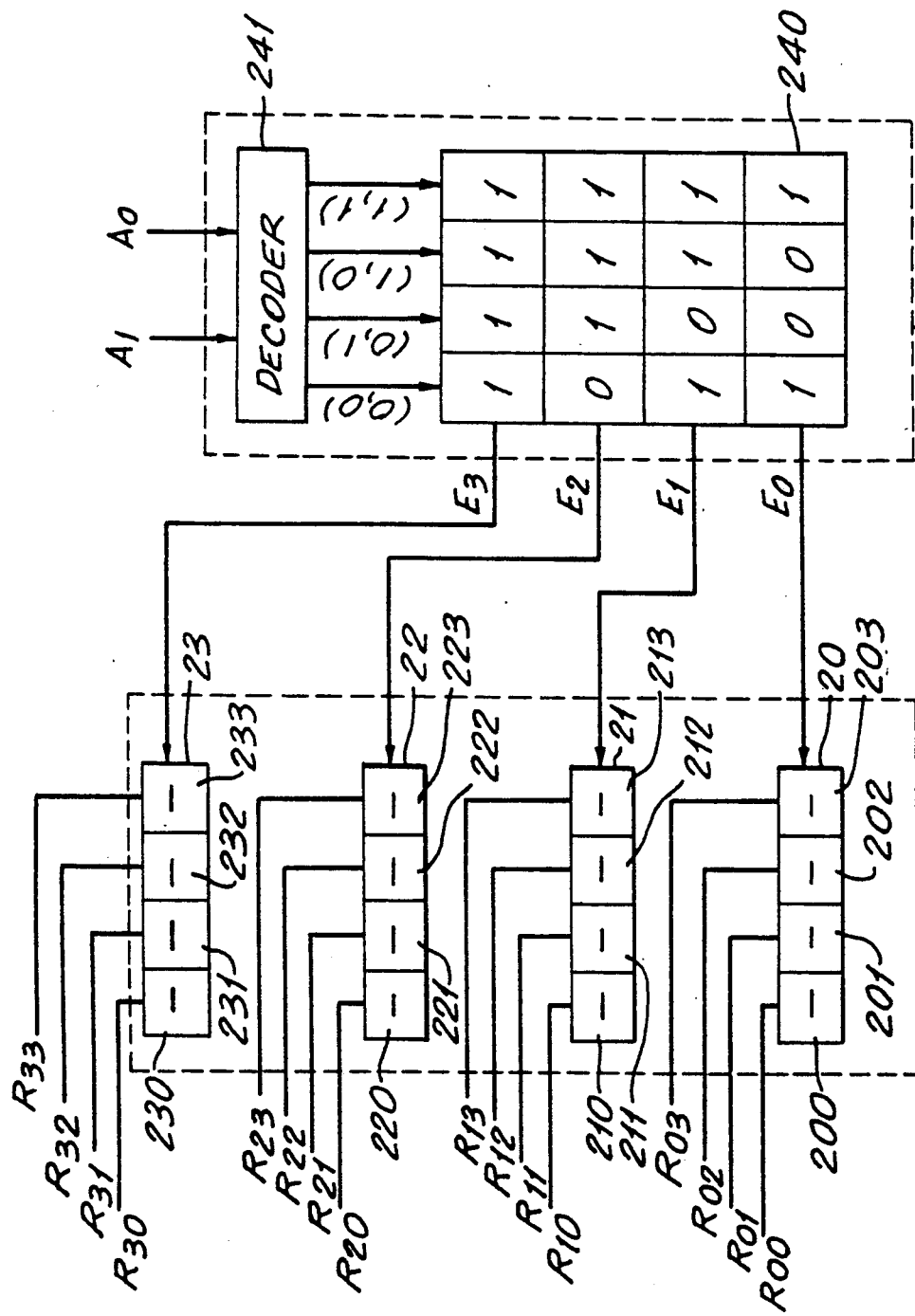
FIGS. 4(a) to 4(e) are diagrams showing the data contents at the respective specified time points (at times $t_1$, $t_3$, $t_5$, $t_7$, and $t_9$ in FIG. 3) of the register circuit of the DAC.
Figure 4B:
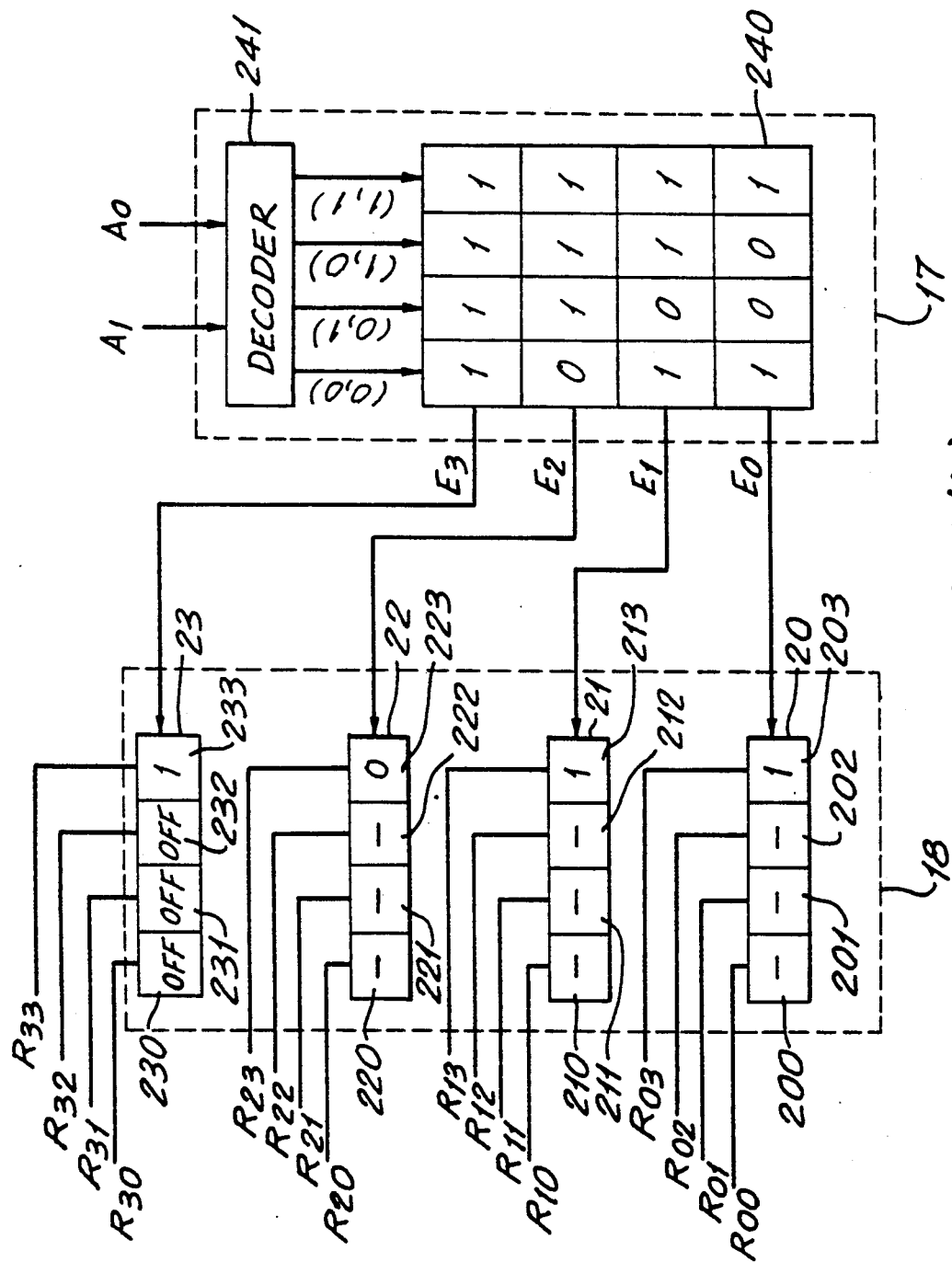
Figure 4C:
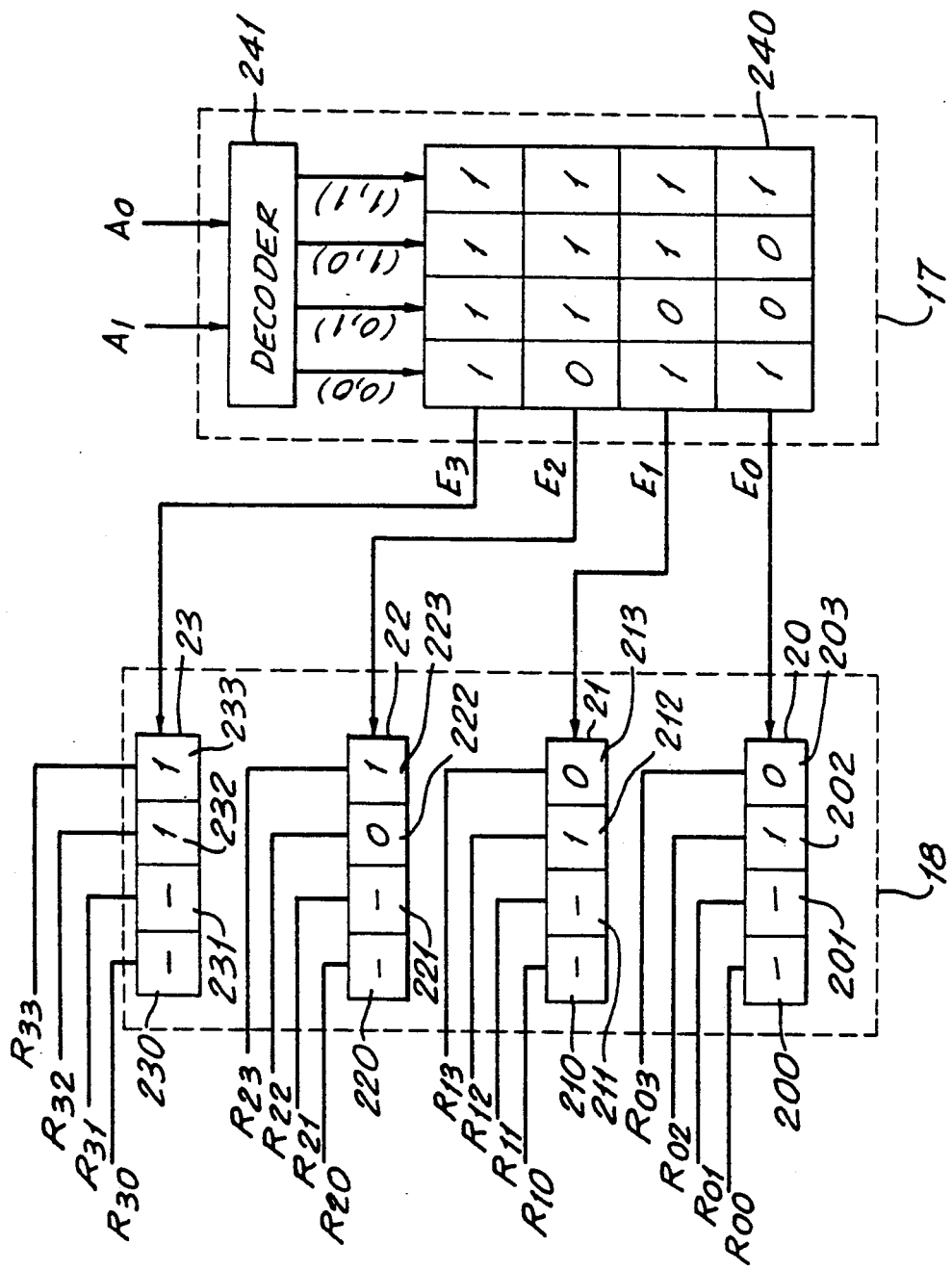
Figure 4D:
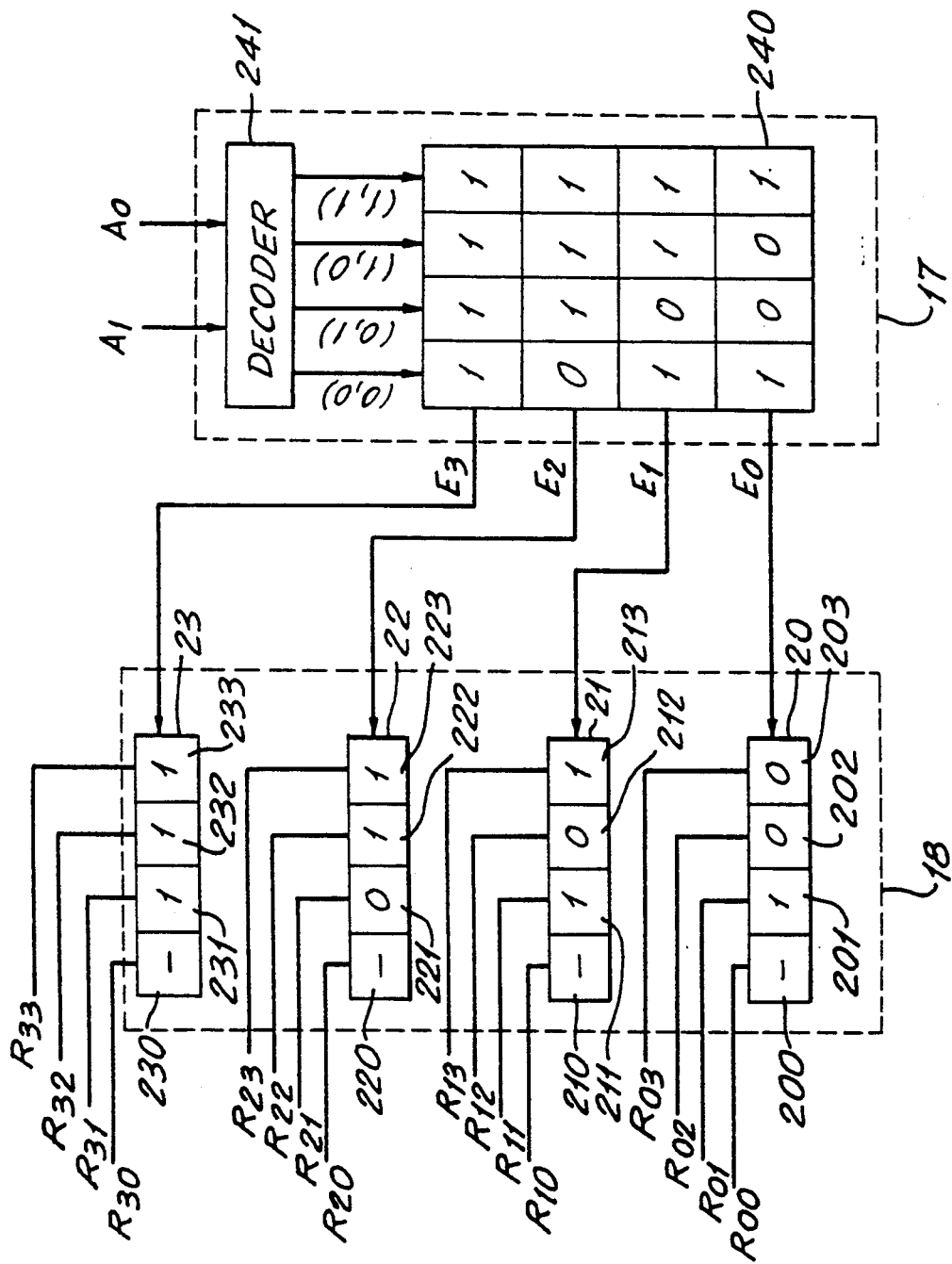
Figure 4E:
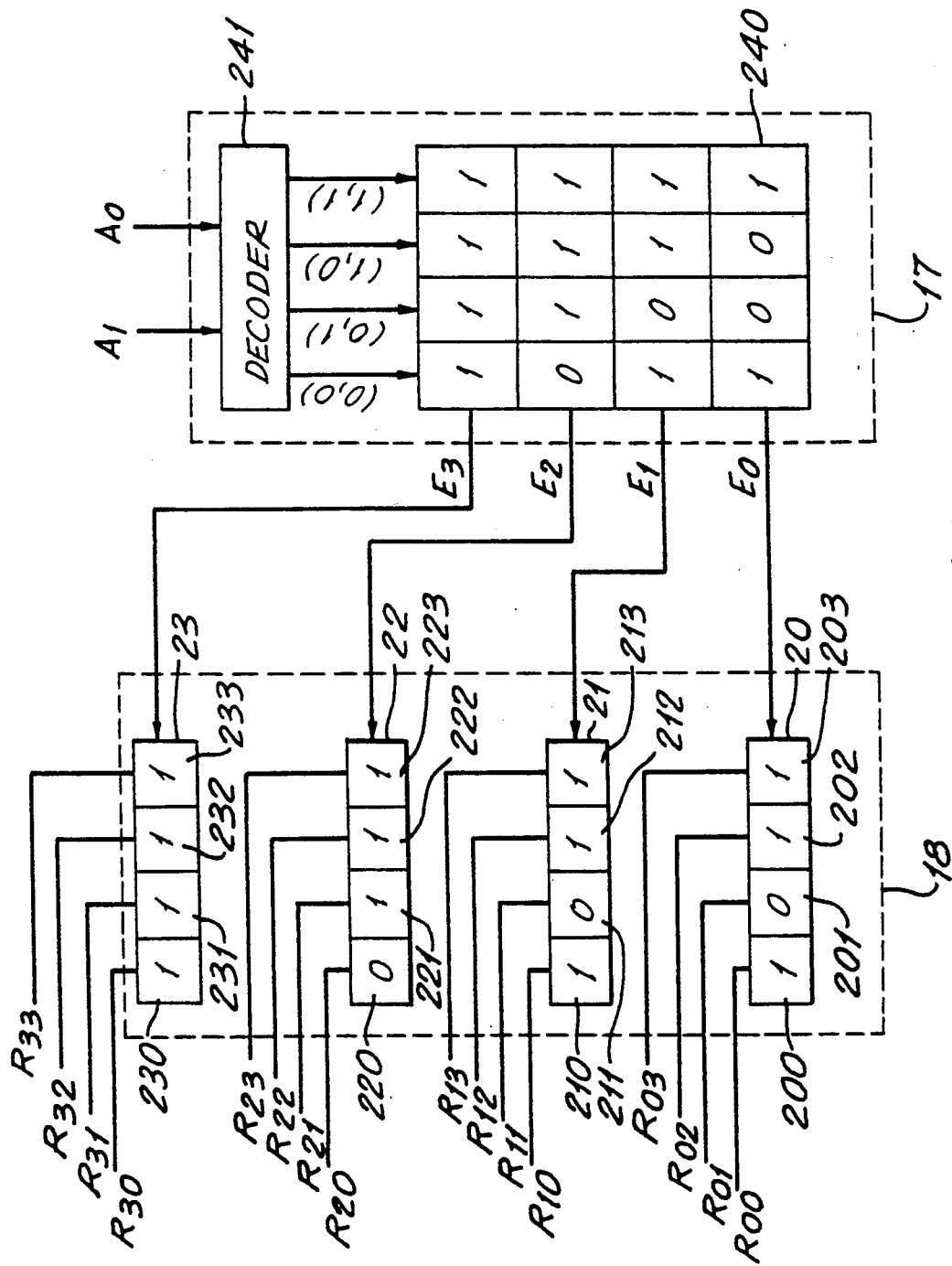

Next, referring also to FIG. 3, during the period when the source voltage Vcc which is applied between the power terminals 5 and 6 of the DAC 100 of the present embodiment and between the power terminals 51 and 52 of the power on clear circuit is in the range between 0 and $V_1$ volts, the output signal of the power on clear circuit 50 is at the low level potential "0", so that the output signal $T_R$ of the reset signal generation circuit 11 goes to "0". Accordingly, the control signal generation circuit 12 and the counter 13 are in the reset state, and the signals $A_0$, $A_1$, $\phi_1$, and $\phi_2$ remain respectively at "0". Similarly, the output signal Ts of the output signal generation circuit 14 remains also at "0".

As the source voltage Vcc reaches $V_1$ volts at the time $t_1$, a high level potential "1" is output at the output terminal 53 of the power on clear circuit 50, and when this signal is input to the second input terminal 15 of the reset signal generation circuit 11, the output signal $T_R$ of the reset signal generation circuit 11 goes to "1" which releases the reset condition of the counter 13. At the time $t_2$ when the control signal $\phi_0$ to the first input terminal 16 goes to "1", the control signal generation circuit 12 and the counter 13 start to operate. The counter 13 counts up at the fall of the output signal $\phi_2$ of the control signal generation circuit 12, and hence, the output code words ($A_0$, $A_1$) of the counter 13 change as shown in Table 1 at times $t_2$, $t_4$, $t_6$, and $t_8$. The code words ($A_0$, $A_1$) are supplied to the EPROM 17

TABLE 1

|  | $t_2$ | $t_4$ | $t_6$ | $t_8$ |
|---|---|---|---|---|
| $A_1$ | 0 | 0 | 0 to 1 | 1 |
| $A_0$ | 0 | 0 to 1 | 1 to 0 | 0 to 1 | as the address signal.

In response to the address signal the decoder 241 of the EPROM 17 selects one column from among the zero-th column to the third column of the memory cell array 240. Namely, it selects the zero-th column ($P_{00}$, $P_{10}$, $P_{20}$, $P_{30}$) at the time $t_2$, and the first column ($P_{01}$, $P_{11}$, $P_{21}$, $P_{31}$), the second column ($P_{02}$, $P_{12}$, $P_{22}$, $P_{32}$), and the third column ($P_{03}$, $P_{13}$, $P_{23}$, $P_{33}$) at times $t_4$, $t_6$, and $t_8$, respectively. The four bits, from the zero-th row to the third row of the selected column are output as the compensation data $E_0$ to $E_3$ corresponding to the conversion error.

The 4-bit compensation data of the EPROM 17 are stored in the registers 20 to 23 in synchronism with the fall of the output signal $\phi_1$ of the control signal generation circuit 12. The time at which the compensation data are output from the EPROM 17 in response to the address signal ($A_0$, $A_1$) of the EPROM 17 and the time at which the compensation data are transferred to the register circuit 18 are as shown in Table 2.

TABLE 2

| $A_0$ | $A_1$ | Time at which compensation data are output | Time at which compensation data are transferred to register circuit |
|---|---|---|---|
| 0 | 0 | — | $t_3$ |
| 0 | 1 | $t_4$ + ACCT | $t_5$ |
| 1 | 0 | $t_6$ + ACCT | $t_7$ |
| 1 | 1 | $t_8$ + ACCT | $t_9$ |

(ACCT means the time required for reading the memory circuit.)

Next, referring to FIGS. 4(a) to 4(e), assume that the compensation data accumulated in the EPROM 17 are $P_{00}=1$, $P_{10}=1$, $P_{20}=0$, $P_+=$, $P_{01}=0$, $P_{11}=0$, $P_{21}=1$, $P_{31}=1$, $P_{02}=0$, $P_{12}=1$, $P_{22}=1$, $P_{32}=1$, $P_{03}=1$, $P_{13}=1$, $P_{23}=1$, and $P_{33}=1$, and that the register circuit 18 is not actuated during the period up to the time $t_1$ so that the data stored in the DFFs 200 to 233 are indefinite.

When it reaches the time $t_2$, the control signal generating circuit 12 starts to operate, but the code words stored in the DFFs 200 to 233 of the register circuit 18 still remain indefinite since the control signal $\phi_1$ which is an output of the circuit 12 remains at "1". At the time $t_3$ the control signal $\phi_1$ falls and the register circuit 18 fetches the output code word $E_0$ to $E_3$ of the EPROM 17. At the time $t_3$ the input address ($A_1$, $A_0$) is (0,0) so that the zero-th column of the memory cell array 240 is selected. Therefore, the output code word ($E_0$, $E_1$, $E_2$, $E_3$) of the EPROM 17 is (1,1,0,1), and the binary values 1,1,0, and 1 are transferred to, and held, in the DFFs 203, 213, 223, and 233, respectively, (FIG. 4(b)). At the time $t_4$ the control signal $\phi_2$ falls and the input address ($A_1$, $A_0$) of the EPROM 17 is changed to (0,1). Accordingly, the first column of the memory cell array 240 is selected and the output code word ($E_0$, $E_1$, $E_2$, $E_3$) becomes (0,0,1,1). At the time $t_5$ the control signal $\phi_1$ falls, the bits stored in the DFFs 203, 213, 223, and 233 are shifted to the next stage DFFs 202, 212, 222, and 232, respectively, and the code word (0,0,1,1) from the first column (corresponding to the address (0,1)) of the EPROM 17 is stored instead in these DFFs 203, 213, 223, and 233. In an analogous manner, at the time $t_6$ the input address ($A_1$, $A_0$) of the EPROM 17 becomes (1,0), the second column corresponding to that address is selected, and the code word (0,1,1,1) is output. At the time $t_7$ the bits stored in the DFFs 203, 213, 223, and 233 are shifted to the next stage DFFs 202, 212, 222, and 232, respectively, the code word (0,1,1,1) from the EPROM 17 is transferred to the DFFs 203, 213, 223, and 233 and held there (FIG. 4(d)).

In this way, the compensation data are successively sent to the register circuit 18 and held there. At the time $t_3$ when the input address ($A_1$, $A_0$) to the EPROM 17 becomes (1,1), the last column, namely, the third column of the memory cell array 240 is selected, and the output code word (1,1,1,1) of that column is transferred to the register circuit 18 at the time $t_9$ and held there. With the above-mentioned operation, the memory contents of the EPROM 17 are all transferred to the register circuit 18 (FIG. 4(e)). At the time $t_{10}$ a set signal with the high level potential "1" is output from the set signal generation circuit and the counter 13 and the control signal generation circuit 12 stop their respective operations.

As described in the above, all of the compensation data accumulated in the EPROM 17 are transferred to and stored in the register circuit during the period the source voltage rises from zero volt to Vc volts that corresponds to the voltage at the starting point of the DA conversion operation.

The DAC 100 which completed the transfer of the correction data from the EPROM 17 to the register circuit 18 as in the above during the transient period in which the source voltage Vcc rises from $V_1$ to Vc as a result of closing of the power switch, is in a state ready to perform the DA conversion of the parallel 6-bit input digital signals ($D_0$ to $D_5$).

The decoder 135 which receives the input of the highest order two bits $D_5$ and $D_4$ of the parallel 6-bits ($D_0$ to $D_5$) supplies a decoded output (0,0,0) to the latch circuits 136 to 138 when the code word ($D_5$, $D_4$) is (0,0). In the same way, when the code word ($D_5$, $D_4$) is (0,1), (1,0), and (1,1), decoded outputs (0,0,1), (0,1,1), and (1,1,1), respectively, are output to the latch circuits 136 to 138. It is possible to improve the accuracy of the linear error compensation by converting the highest order two bits of the input digital signal to three bits as in the above.

Referring again to FIG. 2(b), the switching elements 112 to 122 of the main DAC part 153 and the auxiliary DAC part 154 receive the supply of the parallel 7-bit code word ($S_4$ to $S_{10}$) and the parallel 4-bit code word ($S_0$ to $S_3$) of the compensation data of the matrix switching circuit 19, from the first and the second latch circuit groups 171 and 172, respectively. When the bits of the code word ($S_0$ to $S_{10}$) are all "1", the constant current sources 101 to 111 are connected to the power terminal 132 that is kept at the voltage Vcc (the state in which the movable contacts of the switching elements 112 to 122 are made to fall to the right side in FIG. 2(b)), and respectively act so as to lead a constant current I from the power terminal 132 to the grounding potential. On the other hand, when the bits of the code word ($S_0$ to $S_{10}$) are all "0", the constant current sources 101 to 111 are connected to the resistor element group 174 (the state in which the movable contacts are made to fall to the left side in FIG. 2(b)), and act so as to lead currents from the power terminal 132 to the grounding potential via the resistor element group 174. Every time when each bit of the code word ($S_0$ to $S_{10}$) takes on the value "0" or "1" in response to the digital quantity represented by the parallel 6-bit input digital signal ($D_0$ to $D_5$) the quantities of the currents that are lead from the constant current sources 101 to 111 to the grounding potential vary, the change in the quantities of the current cause the voltage drops in the resistor element group 174, which generates an analog value $V_{OUT}$ corresponding to the code word ($S_0$ to $S_{10}$) between the power terminal 132 and the DA converted output terminal 133.

To describe the relation between the code word ($S_0$ to $S_{10}$) and the DA converted output $V_{OUT}$ in more detail, first, let the current value that flows in the resistor element 123 of the resistor element group 174 be determined when a specific one alone among the switching elements 112 to 118 of the main DAC part 153 is connected to the resistor element group 174 in response to the above-mentioned code word, and only the constant current source that corresponds to the specific one switching element draws a current I to the grounding potential. If one assumes that the specific switching element mentioned above is the switching element 112, then the constant current source 101 alone draws the current I to the grounding potential via the resistor element group 174. Since the value of the resultant resistance of the resistor elements 124 to 131 of the resistor element group 174 is 2R, the current is divided according to the ratio of the resistance value of the resistor element 123 to the resultant resistance value 2R in the above, and the current $I_0$ that flows in the resistor element 123 is evaluated to be $\frac{2}{3}I$. Similarly, the current $I_0$ that flows in the resistor element 123 when the switch element 113 alone is switched on can be evaluated to be $\frac{2}{3}I$. In the same manner, the current $I_0$ that flows in the resistor element 123 corresponding to the states in which only one of the switching elements 114, 115, 116, 117, and 118 is switched on can be evaluated to be $\frac{2}{3}I$, $(\frac{1}{2})\cdot(\frac{2}{3}I)$, $(\frac{1}{2})^2\cdot(\frac{2}{3}I)$, $(\frac{1}{2})^3\cdot(\frac{2}{3}I)$, and $(\frac{1}{2})^4\cdot(\frac{2}{3}I)$, respectively. The current $I_0$ that flows in the resistor element 123 can be evaluated by calculating the current values corresponding to the individual on-state of each one of the switching cells 112 to 118 in the above according to the principle of superposition.

The maximum value of the current $I_0$ that flows in the resistor element 123 is given by the current value for the state in which all of the movable contacts of the switching elements 112 to 118 are made to fall to the right side in FIG. 2(b), which is $$\left(\frac{2}{3}I\right)+\left(\frac{2}{3}I\right)+\left(\frac{2}{3}I\right)+\left(\frac{1}{2}\right)\cdot\left(\frac{2}{3}I\right)+\left(\frac{1}{2}\right)^2\cdot$$

$$\left(\frac{2}{3}I\right)+\left(\frac{1}{2}\right)^3\cdot\left(\frac{2}{3}I\right)+\left(\frac{1}{2}\right)^4\cdot\left(\frac{2}{3}I\right)=$$

$$\left(2^1+2^0+\left(\frac{1}{2}\right)^1+\left(\frac{1}{2}\right)^2+\left(\frac{1}{2}\right)^3+\left(\frac{1}{2}\right)^4\right)\cdot$$

$$\left(\frac{2}{3}I\right)=\left(\frac{63}{16}\right)\cdot\left(\frac{2}{3}I\right).$$

In addition, the minimum value of the current $I_0$ that flows in the resistor element 123 is given by the current value for the state in which all of the movable contacts of the switching elements 112 to 118 are made to fall to the left side in FIG. 2(b), which is equal to zero. Moreover, the minimum step width of the current $I_0$ is determined by the switching on/off of the switching cell 118, and its value is equal to $(\frac{1}{2})^4\cdot(\frac{2}{3}I)$. The product of the current value evaluated in the above and the resistance value of the resistor element 123 gives the DA converted output voltage $V_{OUT}$.

The operation of the main DAC part will be described in more detail by taking the case of the digital input code word ($D_5$, $D_4$, $D_3$, $D_2$, $D_1$, $D_0$) of the parallel six bits is (0,1,0,1,0,1) as an example. Accompanying the code word input, the highest order two bits ($D_5$, $D_4$)=(0,1) are input to the decoder 135. The decoder 135 supplies the respective bits of the 3-bit parallel codes (0,0,1) corresponding to the higher two bits (0,1) to the latch circuits 136, 137, and 138, respectively. These parallel codes (0,0,1) held in the latch circuits 136 to 138 are supplied respectively to the switching elements 112 to 114 as the control inputs. The lowest order four bits (0,1, 0,1) of the digital input code word ($D_5$, $D_4$, $D_3$, $D_2$, $D_1$, $D_0$) are respectively added directly to the latch circuits 139 to 142 to be latched, and are supplied to the switching elements 115 to 118 as a parallel 4-bit control input ($S_7$, $S_6$, $S_5$, $S_4$). In response to the control input (0,1, 0,1) the switching elements 112, 113, 115, and 117 go to the state in which the movable contacts are made to fall to the left side in FIG. 2(b) and the switching elements 114, 116, and 118 go to the state in which the movable contacts are made to fall to the right side. In response to the above-mentioned state of the switching elements 112 to 118, the constant current sources 101, 102, 105, and 107 draws the respective currents I from the power terminal 132 to the grounding potential via the resistor element group 174. The currents that flow in the resistor element due to the above driving of the switching elements 112, 113, 115, and 117 are $\frac{8}{8}I$, $\frac{1}{2}\cdot(\frac{8}{8}I)$, $(\frac{1}{2})^2\cdot(\frac{8}{8}I)$, and $(\frac{1}{2})^3\cdot(\frac{8}{8}I)$, respectively, so that the resultant current $I_0$ that flows in the resistor element 123 is equal to $(42/16)\cdot(\frac{8}{8}I)$ by the principle of superposition. Therefore, the DA converted output $V_{OUT}$ for the parallel 6-bit code word (0,1,0,1,0,1) is equal to $(42/16)\cdot(\frac{8}{8}I)\cdot R$.

Next, the compensation due to the auxiliary DAC part 154 of the conversion error in the main DAC part 153 will be described. The current $I_0$ which flows in the resistor element 123 when only the switching element 119 among the switching elements 119 to 122 is made to fall to the left side in the circuit diagram in FIG. 2(b) to be connected to the resistor element group 174 and the constant current source 108 draws the constant current I, is the same value of $(\frac{1}{2})^3\cdot(\frac{8}{8}I)$ for the case in which the switching element 117 alone is made to fall to the left side. Similarly, the current value $I_0$ for the state in which the switching element 120 alone is made to fall to the left side equals $(\frac{1}{2})^4\cdot(\frac{8}{8}I)$. The current value $I_0$ for the states in which the switching element 121 alone and the switching element 122 alone are made to fall to the left side are $(\frac{1}{2})^5\cdot(\frac{8}{8}I)$ and $(\frac{1}{2})^6\cdot(\frac{8}{8}I)$, respectively. The maximum value of the compensation of the conversion error is obtained corresponding to the current value $I_0$ for the state in which all of the switching elements 119 to 122 are made to fall to the left side, and the maximum value is $(15/64)\cdot(\frac{8}{8}I)$. In addition, the minimum value of the conversion error compensation is zero. Further, the minimum step width of the conversion error compensation can be determined by the response to the switching on/off of the switching element 122, and its value can be found to be $(1/64)\cdot(\frac{8}{8}I)$.

Next, the relation between the quantity of the conversion error and the input digital code word ($D_0$ to $D_5$) will be described. As in the above, the degrees of influence of the highest order two bits ($D_5$, $D_4$) and the lowest order four bits ($D_3$, $D_2$, $D_1$, $D_0$) on the conversion error that appear in the DA converted output $V_{OUT}$ show, from the result in the above that the current value $I_0$ in the case where the switching element 115 draws the constant current I via the resistor element group 174 is $(\frac{1}{2})\cdot(\frac{8}{8}I)$ while the current value $I_0$ in the case where the switching elements 112, 113, and 114 draw the constant current I the resistor element group 174 is $(\frac{8}{8}I)$, that the degree of influence of the switching element 115 can be considered to be 50% of the degree of influence of the switching elements 112 to 114. Similarly, the degrees of influence of the switching elements 116, 117, and 118 are 25%, 12.5%, and 6.75%, respectively, of the degree of influence of the switching elements 112 to 114. Accordingly, the object of the error compensation needs only be limited to the switching cells 112, 113, and 114 that are related to the highest order two bits ($D_5$, $D_4$), and there will arise no practical inconvenience if the switching element 115 is dropped from the object of the compensation.

Next, the correction data for the case when the highest order two bits ($D_5$, $D_4$) are (0,0) will be computed. If the input digital code word ($D_5$, $D_4$, $D_3$, $D_2$, $D_1$, $D_0$) is assumed to be (0,0,1,1,1,1), the switching elements 115 to 118 are all made to fall to the right side in FIG. 2(b) since the lowest order four bits are all "1", and the currents due to these switching elements do not pass through the resistor element 123 and hence they do not influence the conversion error of the DA converted output $V_{OUT}$. On the other hand, the highest order two bits ($D_5$, $D_4$) are (0,0) so that the code word that appear in the outputs of the latch circuits 136 to 138 is (0,0,0) and the switching elements 112 to 114 are made to fall to the left side, and the currents due to these switching elements all pass through the resistor element 123. In this state, the theoretical value of the DA converted output $V_{OUT}$ is $(6/2)\cdot(\frac{8}{8}I)\cdot R$, but the DA conversion errors due to the constant current sources 101, 102, and 103 are inevitable. Now, assume that the intrinsic conversion error of the main DAC part of the DAC measured prior to the storage of the compensation data to the EPROM 17 is $(1/16)\cdot(\frac{8}{8}I)\cdot R$. This conversion error is equal to the output voltage $(1/16)\cdot(\frac{8}{8}I)\cdot R$ of the auxiliary DAC part for the state in which the switching element 120 is made to fall to the left side and the switching elements 119, 121, and 122 are made to fall to the right side, so that the above-mentioned conversion error can exactly be compensated for. In other words, the compensation of the conversion error can be achieved by setting the control input ($S_3$, $S_2$, $S_1$, $S_0$) to the switching elements 119 to 122 of the auxiliary DAC part to (1,0,1,1). These highest order two bits ($D_5$, $D_4$) are made to correspond to the address of the EPROM 17 and the control input (1,0,1,1) is stored in the EPROM 17. Namely, the code word (1,1,0,1) is stored in the zero-th column ($P_{00}$, $P_{10}$, $P_{20}$, $P_{30}$) of the memory cell array 240 of the EPROM 17.

For the case of the highest order two bits ($D_5$, $D_4$) of the input digital signal are (0,1), the compensation data is found in the manner similar to the case of (0,0) in the above. Namely, assume that the lowest order four bits $D_3$ to $D_0$ of the digital input code word ($D_0$ to $D_5$) is all "1", that is (0,1,1,1,1,1). In this case, the highest order two bits (0,1) are converted to the code word (0,0,1) and are latched in the latch circuits 136 to 138. Accordingly, the switching elements 112 and 113 are made to fall to the left side and the switching element 114 is made to fall to the right side, and the theoretical value of the DA converted output $V_{OUT}$ becomes equal to $(4/2)\cdot(\frac{8}{8}I)\cdot R$. Assuming that the conversion errors measured in advance due to the constant current sources 101 and 102 were $(3/64)\cdot(\frac{8}{8}I)\cdot R$, it is possible to generate a compensation output of $\{(\frac{1}{2})^5+(\frac{1}{2})^6\}\cdot(\frac{8}{8}I)\cdot R$, namely, $(3/64)\cdot(\frac{8}{8}I)\cdot R$ for the state in which the switching elements 121 and 122 of the auxiliary DAC part are made to fall to the left side and the switching elements 119 and 120 are made to fall to the right side, so that the above-mentioned conversion error can be eliminated. This conversion error can be accomplished by setting the control input ($S_3$, $S_2$, $S_2$, $S_0$) to the switching elements 119 to 122 of the auxiliary DAC part 154 to the code word (1,1,0,0). For this purpose, the memory contents ($P_{01}$, $P_{11}$, $P_{21}$, $P_{31}$) (FIG. 2(d)) of the first column of the highest order two bits (0,1) of the memory cell array 240 of the EPROM 17 are set to (1,1,0,0). The compensation data for the cases in which the highest order two bits ($D_5$, $D_4$) of the input digital signal are (1,0) and (1,1) can be determined in the procedure analogous to the cases of (0,0) and (0,1), and the memory contents of the second column ($P_{02}$, $P_{12}$, $P_{22}$, $P_{32}$) and the third column ($P_{03}$, $P_{13}$, $P_{23}$, $P_{33}$) of the memory cell array 240 of the EPROM 17 are set to (0,1,1,1) and (1,1,1,1), respectively.

Next, the operation of the auxiliary DAC part 154 will be described more specifically by using the case in which the input digital code word ($D_5$, $D_4$, $D_3$, $D_2$, $D_1$, $D_0$) is (0,1,0,1,0,1) as an example.

As described in the above, the theoretical value of the DA converted output $V_{OUT}$ of the main DAC part 153 corresponding to the input code word (0,1,0,1,0,1) is $(42/16) \cdot (\frac{8}{3}I) \cdot R$. In reality, however, in the main DAC part 153, there are generated conversion errors due to the constant current sources 101 to 107 and the resistor element circuit group 174. Assume, then, that the actual measured value of the DA converted outout $V_{OUT}$ that includes the error is $(42/16) \cdot (\frac{8}{3}I) \cdot R - (4/64) \cdot (\frac{8}{3}I) \cdot R$. The register circuit 18 is holding the compensation data which was transferred from the EPROM 17 through the above-mentioned process. Since the highest order two bits ($D_5$, $D_4$) of the input code word (0,1,0,1,0,1) are (0,1), the matrix switching circuit 19 selects the output signals $R_{01}$, $R_{11}$, $R_{21}$, and $R_{31}$ of the DFFs 201, 211, 221, and 231 by means of the semiconductor switches 24 to 27. In other words, the control output ($S_3$, $S_2$, $S_1$, $S_0$) from the matrix switching circuit 19 will have the value (1,1,0,0) (see FIG. 4(c)). Since the switching elements 121 and 122 of the auxiliary DAC part are made to fall to the left side due to the control output ($S_3$, $S_2$, $S_1$, $S_0$), currents flow through the resistor element circuit group 174, the error correction quantity of the DA converted output $V_{OUT}$ of the main DAC part 153 becomes $$\{(\tfrac{1}{2})^5 + (\tfrac{1}{2})^6\} \cdot (\tfrac{8}{3}I) \cdot R = (3/64) \cdot (\tfrac{8}{3}I) \cdot R.$$

Therefore, the DA converted output $V_{OUT}$ becomes $$(42/16) \cdot (\tfrac{8}{3}I) \cdot R - (2/64) \cdot (\tfrac{8}{3}I) \cdot R + (3/64) \cdot (\tfrac{8}{3}I) \cdot R = (42/16 - 1/64) \cdot (\tfrac{8}{3}I).$$

The DA conversion of the first embodiment is equal to the unit change quantity of the DA converted output $V_{OUT}$ corresponding to the unit change quantity of the least significant bit (LSB) $D_0$ of the input digital code word ($D_5$, $D_4$, $D_3$, $D_2$, $D_1$, $D_0$), which is equal to $$(\tfrac{1}{2})^4 \cdot (\tfrac{8}{3}I) \cdot R.$$

Figure 5:
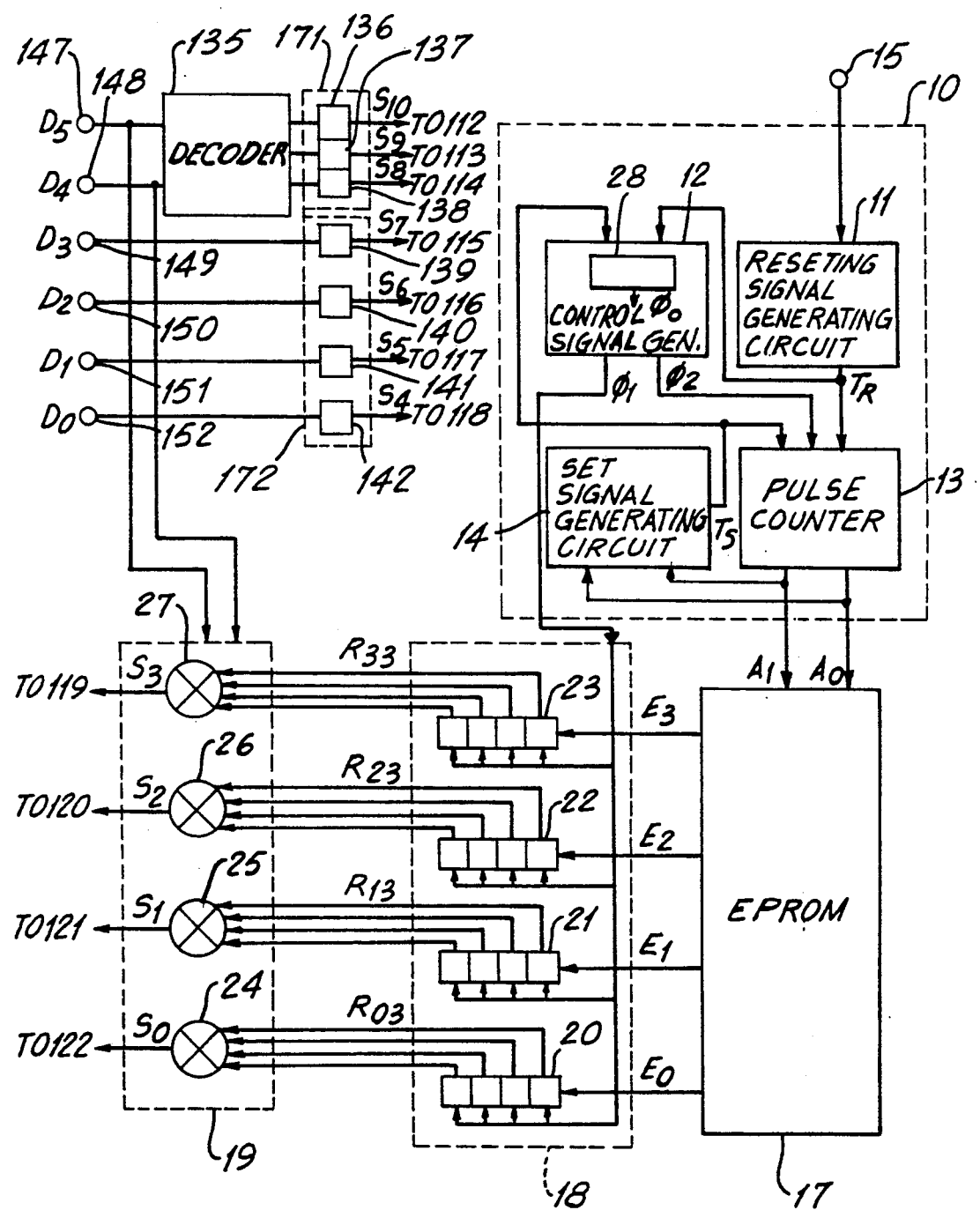
FIG. 5 is a circuit diagram for the same part as in FIG. 2 of the DAC which is a second embodiment of the present invention.

Next, referring to FIG. 5, the second embodiment of the DAC shown in the figure is so arranged as to generate the control signal $\phi_0$ by an oscillation circuit built in the control signal generation circuit 12 instead of its being supplied externally as in the first embodiment. Since the second embodiment is identical to the first embodiment except for this point, various components are given reference numerals same as those in FIG. 2(a) to omit further explanation.

Figure 6:
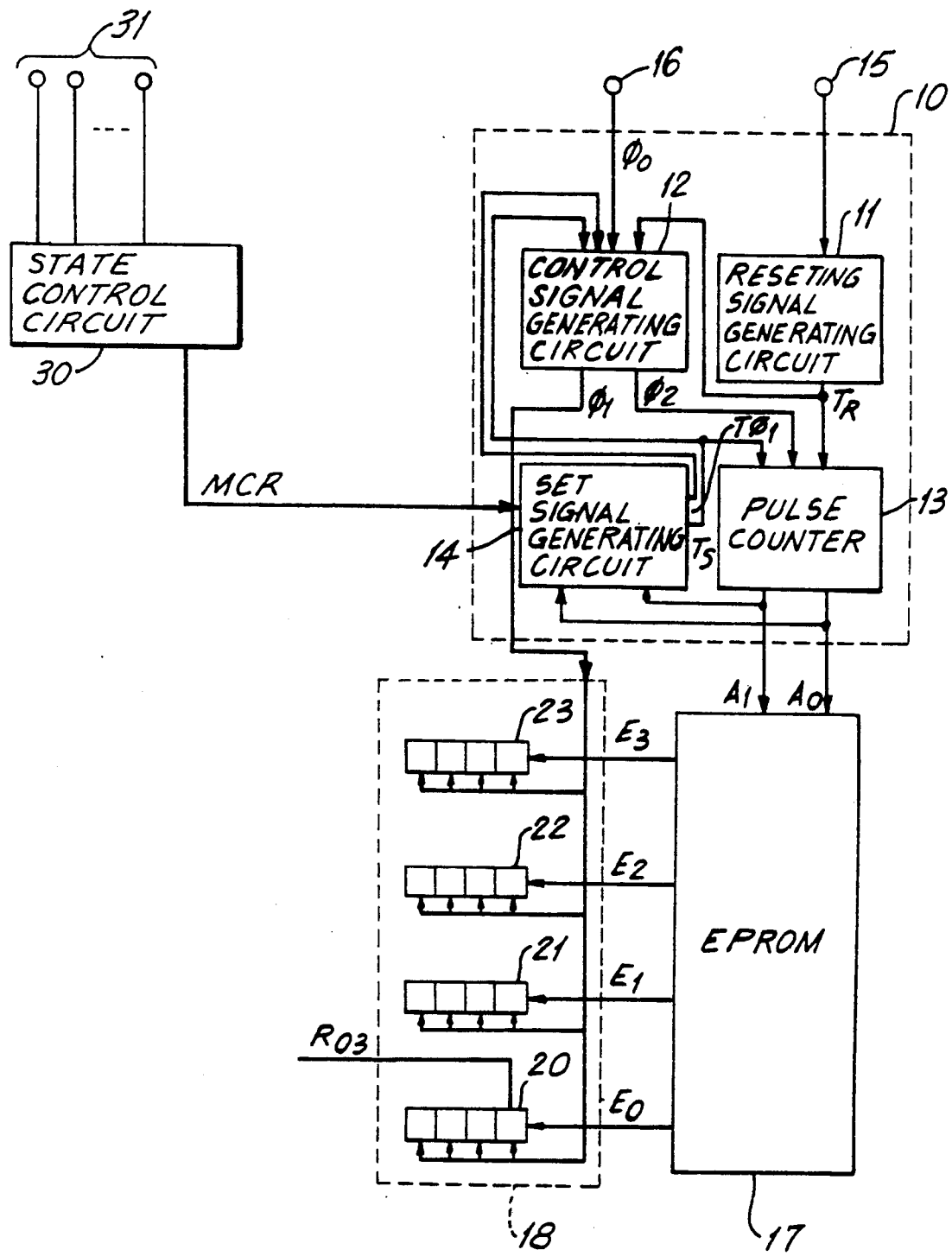
FIG. 6 is a circuit diagram for the same part as in FIG. 2 of the DAC which is a third embodiment of the present invention.

Next, referring to FIG. 6, the third embodiment of the DAC according to the present invention shown by the figure is characterized in that there is added a state control circuit 30 is added to the first embodiment and that the set signal generation circuit 14 not only generates the stop control signal Ts but also generates an output $T\phi_1$ for controlling the control signal generation circuit.

The state control circuit 30 has third input terminals which receive the supply of parallel 1-bit (1 is a natural number) input digital signals, receives the above-mentioned control signal at these third input terminals 31, and outputs an output signal MCR. The output signal MCR gives the data transfer start address of the EPROM 17 to the set signal generation circuit 14 as a control input. The data transfer control circuit 10 has the same construction as that of the first embodiment except that the output $T\phi_1$ of the set signal generation circuit 14 is supplied to the control signal generation circuit 12.

Figure 7:
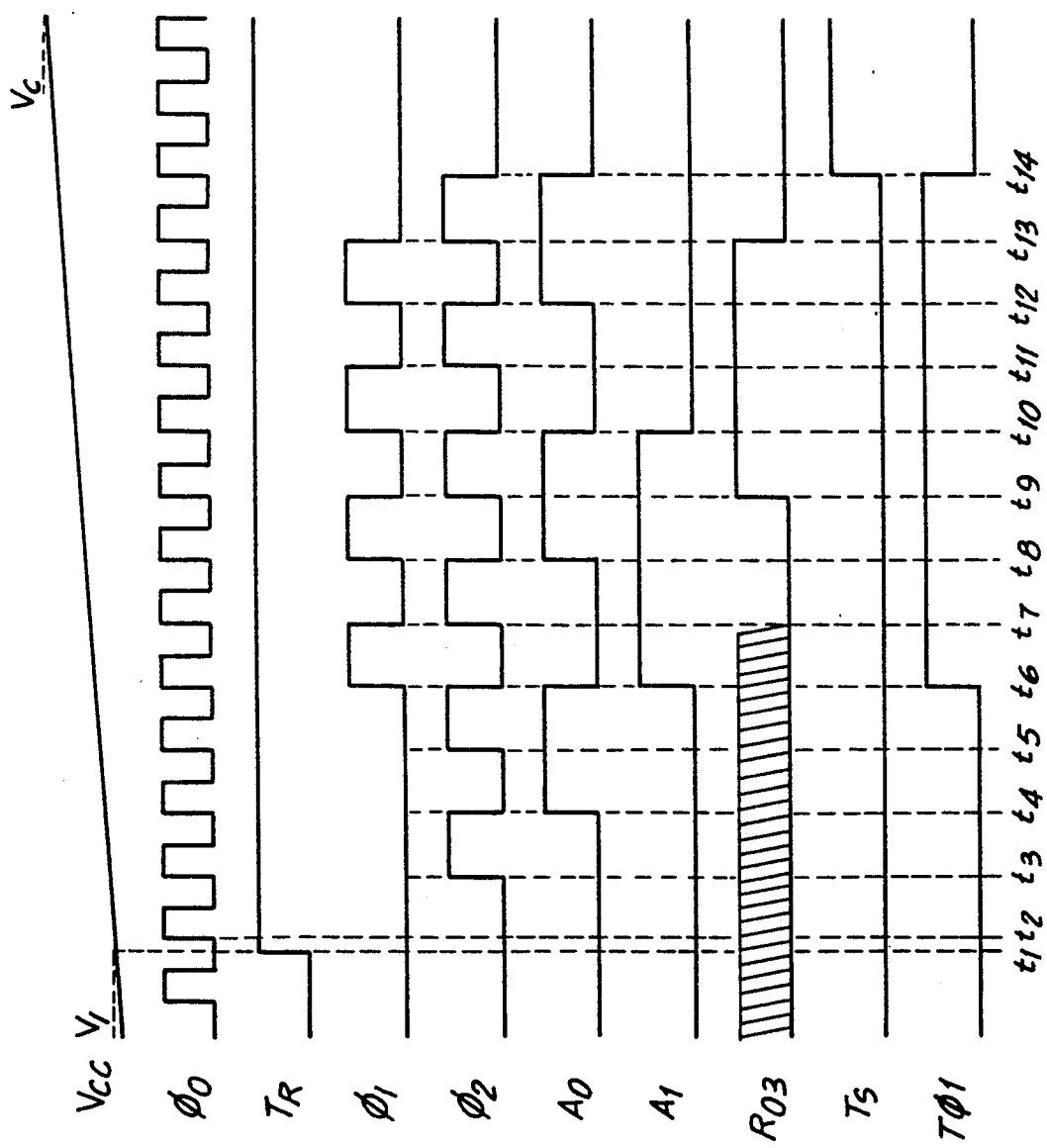
FIG. 7 is a signal waveform diagram for describing the operation of the DAC in FIG. 6.

Referring again to FIG. 6, in the third embodiment of the DAC, the address of the EPROM 17 from which the data stored in the EPROM 17 is to be transferred to the register circuit 18 is supplied to the input terminal train 31 of the state control circuit 30 as a control input. The operation will be described by representing the starting address of data transfer by the address input ($A_1$, $A_0$) and using the case of (1,0) as an example (the correction data stored in the EPROM 17 is the same as in the case of the first embodiment; see FIG. 4(a)). Referring also to FIG. 7, during the period in which the source voltage rises from zero to $V_1$ volts the control signal generation circuit 12 and the counter 13 are in the reset state same as in the first embodiment. In addition, the output signal $T_R$ of the reset signal generation circuit 11 is "0". Moreover, the output signals Ts and $T\phi_1$ of the set signal generation circuit 14 are also "0".

When the source voltage Vcc reaches $V_1$ volts at the time $t_1$, a signal is supplied from the power on clear circuit 50 (FIG. 1) to the second input terminal 15 of the reset signal generation circuit 11 and the output signal $T_R$ becomes a reset release signal. At the time $t_2$ when the control signal $\phi_0$ input to the first input terminal 16 goes to "1" the control signal generation circuit 12 and the counter 13 start their operation same as in the first embodiment.

At the time $t_3$ the output signal $T\phi_1$ of the set signal generation circuit 14 remains at "0" since the address (1.0) the data transfer starting point of the EPROM is input to the input terminal 31 of the state control circuit 30. Accordingly, the output signal of the control signal generation circuit 12 remains at "0" and the output signal $\phi$ and the counter 13 continue the operation.

At the time $t_4$, the counter 13 starts counting in response to the output signal $\phi_2$ of the control signal generation circuit 12 and the output ($A_1$, $A_0$) of the counter 13 becomes (1,0). As a result, the first column of the memory cell array 240 of the EPROM 17 is selected and the output signals $E_0$ to $E_3$ go to $E_0=0$, $E_1=0$, $E_2=1$, and $E_3=1$.

At the time $t_5$, the output signal $T\phi_1$ of the set signal generation circuit 14 remains at "0" since the address of the data transfer start point of the EPROM 17 is (1,0) as in the state at the time $t_3$ in the above, and the output signal $\phi_1$ of the control signal generation circuit 12 still remains at "0". As a result, the output signals $E_0$ to $E_3$ of the EPROM 17 are not transferred to the register circuit 18, and the data in the registers 20 to 23 remain indefinite.

Next, at the time $t_6$, the counter 13 counts further up and the output ($A_1$, $A_0$) becomes (1,0). As a result, the second column of the memory cell array 240 of the EPROM 17 is selected, and the output signals $E_1$ to $E_3$ become $E_0=0$, $E_1=1$, $E_2=1$, and $E_3=1$. In addition, the data transfer start point address (1,0) of the EPROM 17 and the output (1,0) of the counter 13 become equal so that the output signal $T\phi_1$ of the set signal generation circuit 14 goes to "1". Therefore, the control signal $\phi_1$ presents itself after the time $t_6$.

At the time $t_7$, the waveform of the control signal $\phi_1$ falls, and the output signals $E_0=0$, $E_1=1$, $E_2=1$, and $E_3=1$ of the second column of the memory cell array 240 of the EPROM 17 are transferred to the DFFs 203, 213, 223, and 233 of the registers 20 to 23 at the time $t_7$.

The address of the EPROM 17 for stopping the transfer of the data is controlled to the address one unit before the address for starting data transfer by means of the output signal MCR from the state control circuit 30. Namely, since the stop address $(A_1, A_0)$ is (0,1) so that the correction data of the EPROM 17 are transferred sequentially to the register circuit 18 from the time $t_8$ to the time $t_{13}$.

Figure 11:
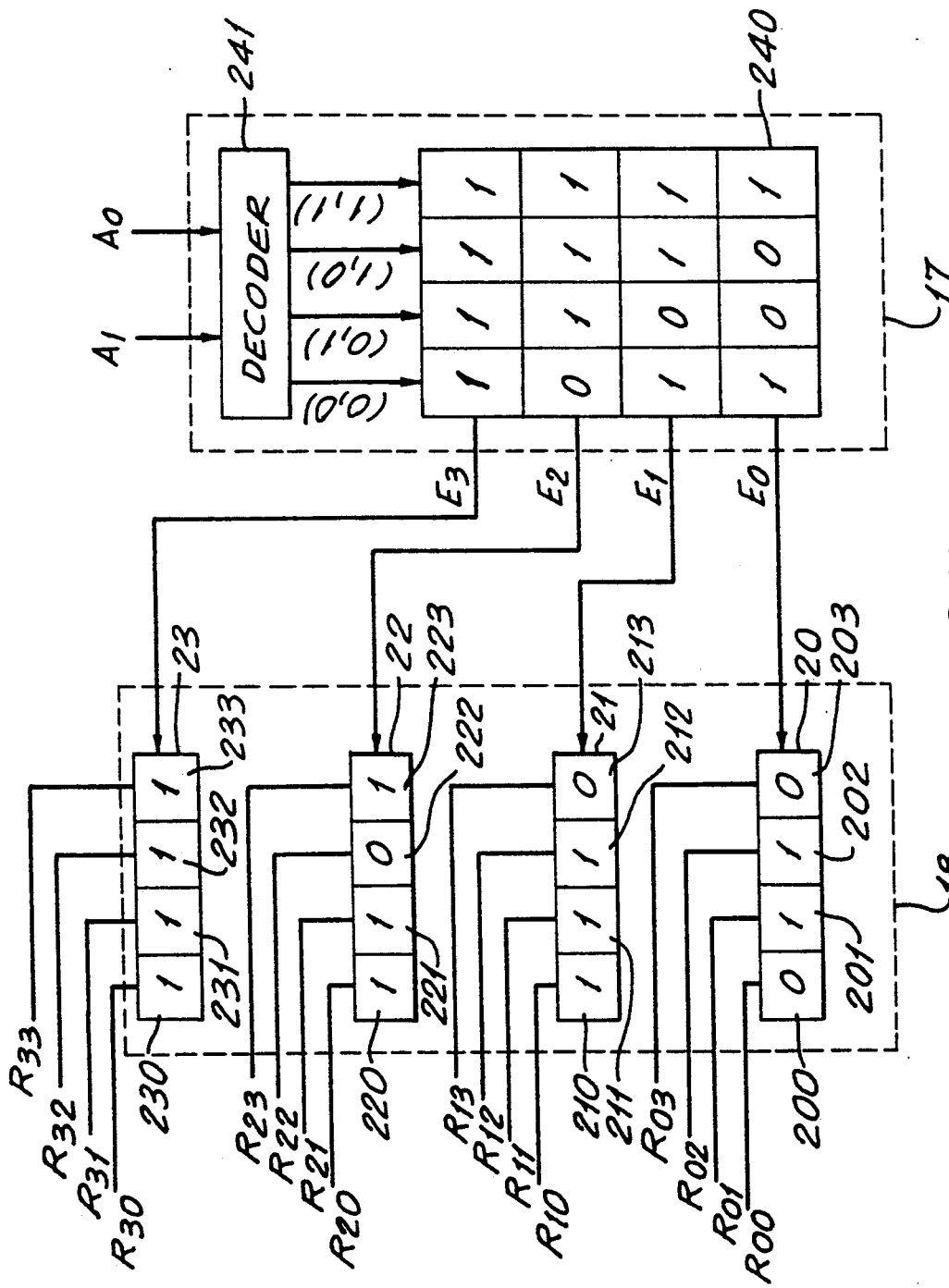
FIG. 11 is a diagram showing the data contents at specified time points (time $t_{13}$ in FIG. 7) of the DAC of the third embodiment of the present invention.

At the time $t_{14}$, the output $(A_1, A_0)$ of the counter 13 goes to (0,1), the stop control signal Ts and the set signal $T\phi_1$ go respectively to "1" and "0", and the data transfer and the operation of the counter 13 are stopped. At this time point, the data of the second column of the EPROM 17 are held in the DFFs 200, 210, 220, and 230 of the register circuit, the data of the third column are held in the DFFs 201, 211, 221, and 231, the data of the zero-th column are held in the DFFs 202, 212, 222, and 232, and the data of the first column are held in the DFFs 203, 213, 223, and 233 (see FIG. 11).

By the operation described in the above, the accumulated data in the EPROM 17 undergo address change and are transferred and held in the register circuit 18. Namely, the correction data can be changed without rewriting the accumulated data in the EPROM 17. That, along with the application of the voltage Vcc, the data transfer is completed before the rise of the voltage to Vc, and the device is in a state ready to start the DA operation at the time of application of the input digital code word $D_0$ to $D_5$ is the same as in the first embodiment, so that a further description will be omitted.

Figure 8:
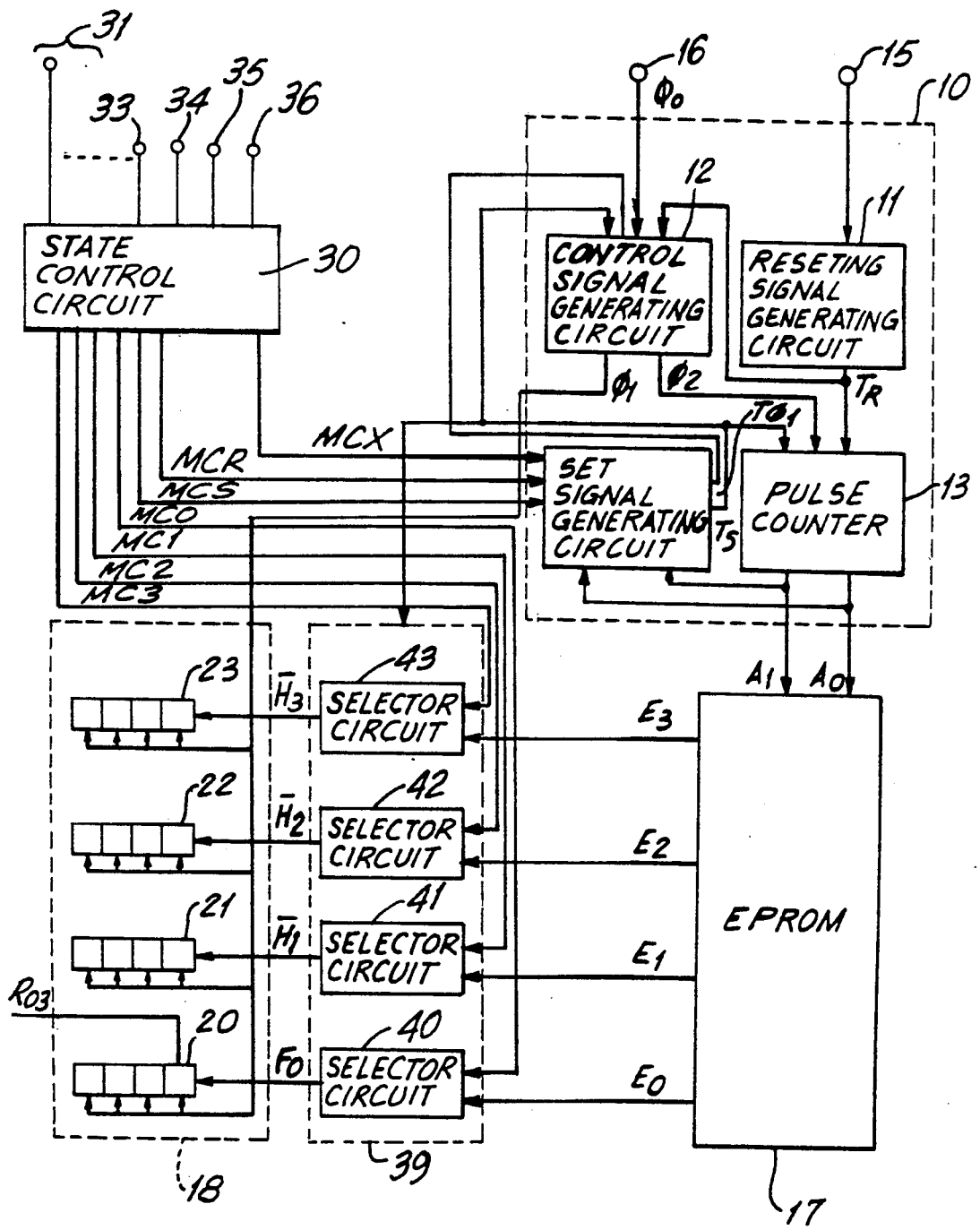
FIG. 8 is a circuit diagram for the same part as in FIG. 2 of the DAC which is a fourth embodiment of the present invention.

Further, referring to FIG. 8, the fourth embodiment of the DAC according to the present invention is characterized in that four out of the input terminals 31 to deal with the parallel l bits of the state control circuit 30 are designated as data input terminals 33 to 36 and that the circuit 30 generates 4-bit data outputs $MC_0$ to $MC_3$ as well as the output signals MCS and MCX to the set signal generation circuit 14. The output signal MCS gives the data transfer completion addreess of the EPROM 17 and the output signal MCX gives the number of the data to be transferred from the outside to the set signal generation circuit 14 as the control signals.

The DAC of the present embodiment has selector circuits 40, 41, 42, and 43 which receive at their respective input terminals the data output signals $MC_0$, $MC_1$, $MC_2$, and $MC_3$ from the state control circuit 30 and the output signals $E_0$, $E_1$, $E_2$, and $E_3$ from the EPROM 17, supplies a signal Ts from the set signal generation circuit 14 as the control signal for switching the input signals to the selector circuit group 39 consisting of the selector circuits 40 to 43, and inputs the output signals $F_0$ to $F_3$ of the selector circuits 40 to 43 to the registers 20 to 23. The remaining construction is the same as in the third embodiment.

Figure 9:
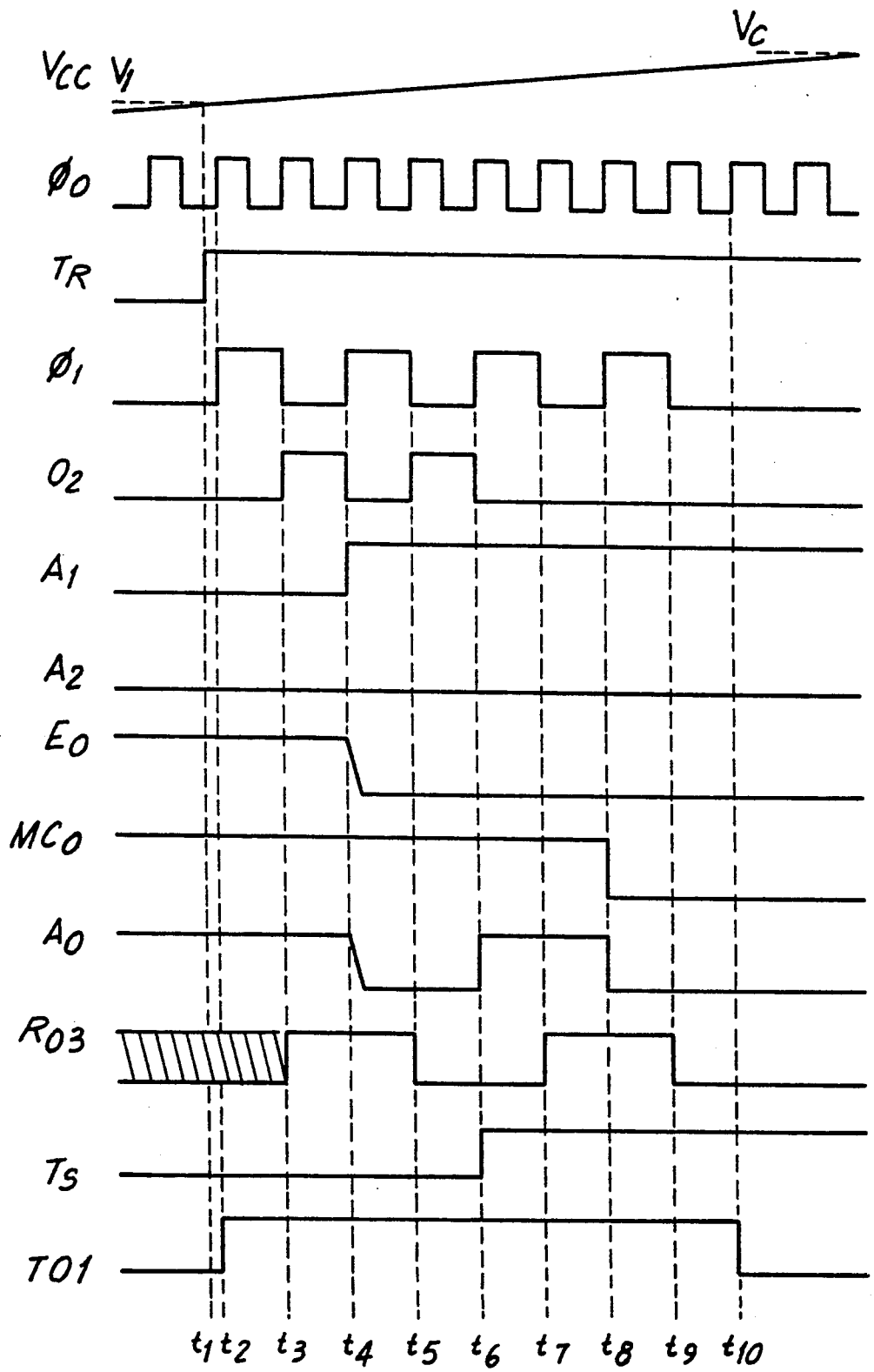
FIG. 9 is a signal waveform diagram for describing the operation of the DAC shown in FIG. 8.

Referring also to FIG. 9, the operation of the fourth embodiment of the DAC will be described. Here, it will be assumed that the address of the starting point of transfer of the data in the EPROM 17 is (0,0), and the address of the completion point of data transfer is (0,1). Further, the external data corresponding to the data $(P_{02}, P_{12}, P_{22}, P_{32})$ and $(P_{03}, P_{13}, P_{23}, P_{33})$ at the addresses (1,0) and (1,1) of the EPROM 17 are represented by $(X_{02}, X_{12}, X_{22}, X_{32})$ and $(X_{03}, X_{13}, X_{23}, X_{33})$ which have values of (1,0,0,1) and (0,1,1,0), respectively.

During the period in which the source voltage changes from zero volt to $V_1$ volts, the control signal generation circuit 12 and the counter 13 are in the reset state in the same way as in the first and the third embodiments. Further, the output signal $T_R$ of the reset signal generation circuit 11 is at "0", and the outputs Ts and $T\phi_1$ of the set signal generation circuit 14 are also at "0".

At the time $t_1$ when the source voltage Vcc becomes $V_1$ volts, a signal is input to the input terminal 15 to the reset signal generation circuit 11 and the output $T_R$ becomes a reset release signal. When it reaches the time $t_2$ when the control signal $\phi_0$ to the input terminal 16 goes to "1" the control signal generation circuit 12 and the counter 13 start operation similar to the case of the first and the third embodiments.

Since the data transfer start point address (0,0) and the data transfer completion point address (0,1) of the EPROM 17 are already input in the state control circuit 30 during the period from the time $t_3$ to the time $t_5$, the data of the EPROM 17 are transferred to the register circuit 18.

At the time $t_6$, the output $(A_1, A_0)$ of the counter becomes (0,1) and the stop control signal Ts goes to "1", and the operation of the counter 13 and the control signal generation circuit 12 is stopped. On the other hand, the output MCX of the state control circuit 30 shows that there are two pieces of external data so that the output signal $T\phi_1$ of the set signal generation circuit 14 remains at "1", and the output $\phi_1$ from the control signal generation circuit 12 continues to remain at the same value. In addition, the state control signal Ts controls the selector circuit group 39 so as input the outputs $MC_0$, $MC_1$, $MC_2$, and $MC_3$ of the state control circuit 30 when the signal Ts itself is at "1".

Accordingly, during the period from the time $t_7$ to the time $t_9$ the external data $X_{20}$ to $X_{23}$ and $X_{30}$ to $X_{33}$ are transferred to the register circuit 18.

At the time $t_{10}$, the output signal $T\phi_1$ of the set signal generation circuit 14 goes to "0", and the output $\phi_1$ of the control signal generation circuit 12 goes to zero.

With the above-mentioned process, a part of the accumulated data in the EPROM 17 and the external data are transferred to the register circuit 18 and held there. Therefore, the correction data can be changed without rewriting the accumulated data in the EPROM 17.

In the DA 100 of the present embodiment, when the source voltage Vcc is raised to Vc after the closing of the power switch, the DA conversion of the input digital signals $D_0$ to $D_5$ will be started. Since this point is the same as in the first and the third embodiments, the description of the operation will be omitted.

Figure 10:
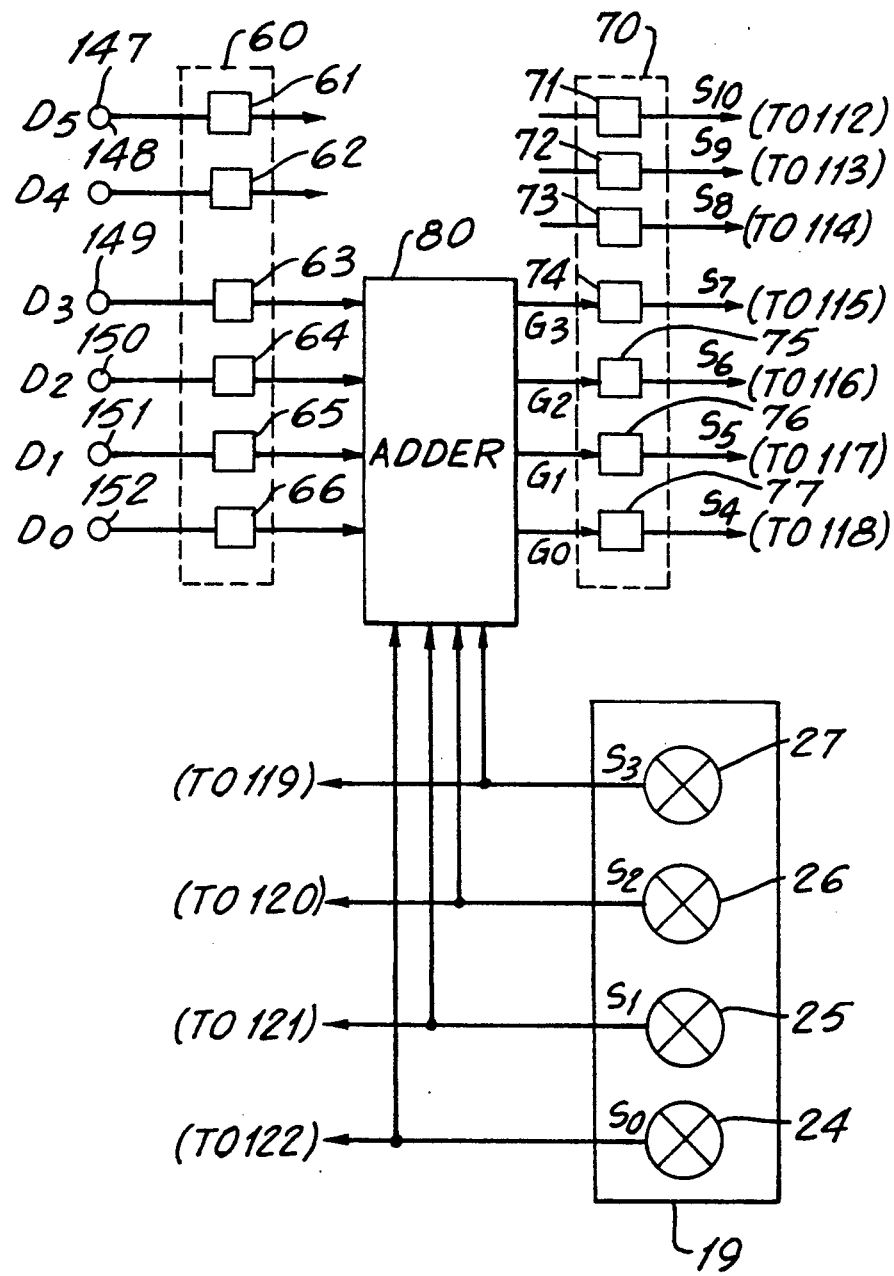
FIG. 10 is a modified circuit diagram of the embodiments of the present invention.

Next, referring to FIG. 10, a modification commonly applicable to the first to the fourth embodiment includes a third circuit group 60 consisting of latch circuits 61 to 66 which receive directly and latch the bit-parallel input digital signals $D_0$ to $D_5$, an adder 80 which adds the lower order four bits of the $D_0$ to $D_3$ of the input digital signals $D_0$ to $D_5$ and the 4-bit outputs $S_0$ to $S_3$ of the matrix switching circuit 19, and a fourth latch circuit group 70 consisting of latch circuits 74 to 77 which latch the output $G_0$ to $G_3$ of the adder 80 and latch circuits 71 to 73 which latch the highest order three bits $S_8$ to $S_{10}$ of the code word $S_0$ to $S_{10}$, and supplies the output $S_4$ to $S_{10}$ of the fourth latch circuit 70 to the switching elements 112 to 118 of the main DAC part 153.

According to this modification of the embodiments of the present invention, it is possible to change the control signals of the switching elements 115 to 118 of the main DAC part 153 by the addition of the correction data and the lowest order four bits $D_0$ to $D_3$ of the input digital signals $D_0$ to $D_5$. In other words, besides the conversion error correction in the auxiliary DAC part 154, a conversion error correction based on the lower order bits of the main DAC part becomes available, so that a correction which exceeds the upper limit of the conversion quantity allowable to the auxiliary DAC part 154 becomes feasible. That is, depending upon the characteristics of the main DAC part 153, a digital to analog converter with higher resolution becomes realizable.

As described in the above, in the DAC according to the present invention, the error data accumulated in the memory circuit corresponding to the conversion error detected in advance are transferred to and held in the register circuit within the rise period of the source voltage. After the source voltage reaches the operating voltage, the matrix switching circuit is activated in response to the higher order bits which are the object of the conversion error compensation among the bit-parallel input digital code words so as to carry out the compensation of the conversion error by causing the device to select the compensation data held in the register circuit. Therefore, there is no need to read the error data from the memory circuit every time when input digital code words requiring correction are applied, and it is possible to markedly increase the response speed compared with the prior art. For example, the read time of the memory circuit is about 500 ns, and the response time of the DAC according to the present invention is ten odd nanoseconds in contrast to the response time of about 1.2 μs for the prior art DAC, so that a DAC with speed several to several tens of times faster than the prior art DAC can be realized.

Although the invention has been described with reference to specific embodiments, this description is not meant to be construed in a limited sense. Various modifications of the disclosed embodiments, as well as other embodiments of the invention, will become apparent to persons skilled in the art upon reference to the description of the invention. It is therefore contemplated that the appended claims will cover any modifications or embodiments as fall within the true scope of the invention.

What is claimed is:

1. A digital-to-analog converter comprising a first converter unit for performing a digital-to-analog conversion operation on input digital data supplied thereto and for generating an output analog signal corresponding to said digital data, a second converter unit receiving an error compensation information supplied thereto and, in response to said error compensation information, reducing a digital-to-analog conversion error between said output analog signal and a desired analog signal, a memory for storing a plurality of error compensation data, a register circuit connected to said memory and having a plurality of sets of output terminals, a writing circuit for writing said plurality of error compensation data stored in said memory into said register circuit, each set of said plurality of sets of output terminals of said register circuit outputting an associated one of said plurality of error compensation data so that said plurality of error compensation data are outputted in parallel with one another, and a selector circuit coupled between said second converter unit and each of said plurality of sets of output terminals of said register circuit for selecting and supplying one of said plurality of error compensation data to said second converter unit in response to said input digital data.

2. The digital-to-analog converter as claimed in claim 1, wherein said writing circuit is activated in response to application of a power supply voltage to the digital-to-analog converter so that writing of said plurality of error compensation data into said register circuit is completed before said first converter unit starts performing the digital-to-analog conversion operation on said input digital data.

3. The digital-to-analog converter as claimed in claim 2, wherein said writing circuit includes a counter for producing address information in sequence to read out each of said plurality of error compensation data from said memory.

4. A digital-to-analog converter comprising a set of input terminals supplied with digital data to be converted into analog data, storage means for storing a plurality of error compensation data, said storage means having a plurality of sets of output nodes, each set outputting an associated one of said plurality of error compensation data so that said plurality of error compensation data are outputted in parallel with one another, selector means coupled to each of said plurality of sets output nodes of said storage means for selecting one of said plurality of error compensation data to produce selected error compensation information in response to said digital data, and converter means for performing a digital-to-analog conversion operation on said digital data, said converter means being coupled to said set of input terminals and said selecting means and processing said selected error compensation information to generate an output analog signal corresponding to said digital data in which an error has been suppressed by said selected error compensation information.

5. The digital-to-analog converter as claimed in claim 4, wherein said storage means includes a memory storing said plurality of error compensation data, and a register circuit coupled to said memory for copying said plurality of error compensation data, said register circuit having a plurality of sets of outputs, each set outputting an associated one of said plurality of error compensation data so that said plurality of error compensation data are outputted in parallel with one another, and said plurality of sets of outputs being connected to said plurality of sets of output nodes, respectively.

6. The digital-to-analog converter as claimed in claim 5, wherein said register circuit copies said plurality of error compensation data in response to application of a power supply voltage to the digital-to-analog converter so that copying of said plurality of error compensation data is completed before said converter means starts performing the digital-to-analog conversion operation.

7. The digital-to-analog converter as claimed in claim 4, wherein said converter means includes a first converter converting said digital data into a first analog signal, a second converter converting said selected error compensation information into a second analog signal, and means for combining said first and second analog signals to generate said output analog signal.

* * * * *